(12) United States Patent
Kabune et al.

(10) Patent No.: US 11,114,316 B2
(45) Date of Patent: Sep. 7, 2021

(54) SUBSTRATE TREATING APPARATUS

(71) Applicant: SCREEN Holdings Co., Ltd., Kyoto (JP)

(72) Inventors: Kota Kabune, Kyoto (JP); Masahito Kashiyama, Kyoto (JP); Yasuo Takahashi, Kyoto (JP); Koji Nishiyama, Kyoto (JP); Chiho Harayama, Kyoto (JP)

(73) Assignee: SCREEN Holdings Co., Ltd.

( * ) Notice: Subject to any disclaimer, the term of this patent is extended or adjusted under 35 U.S.C. 154(b) by 727 days.

(21) Appl. No.: 15/654,035

(22) Filed: Jul. 19, 2017

(65) Prior Publication Data

US 2018/0025921 A1 Jan. 25, 2018

(30) Foreign Application Priority Data

Jul. 25, 2016 (JP) .............................. JP2016-145503
Jul. 25, 2016 (JP) .............................. JP2016-145504
Jul. 25, 2016 (JP) .............................. JP2016-145505

(51) Int. Cl.
*H01L 21/67* (2006.01)
*H01L 21/302* (2006.01)
(Continued)

(52) U.S. Cl.
CPC ......... *H01L 21/67028* (2013.01); *G03D 3/06* (2013.01); *G03F 7/16* (2013.01);
(Continued)

(58) Field of Classification Search
None
See application file for complete search history.

(56) References Cited

U.S. PATENT DOCUMENTS

2004/0050491 A1*  3/2004  Miya ....................... B08B 17/00
                                                          156/345.11
2006/0042666 A1*  3/2006  Tsujimura ................. B08B 3/02
                                                          134/95.2
(Continued)

FOREIGN PATENT DOCUMENTS

JP      H01-231964 A     9/1989
JP      H11-128812 A     5/1999
(Continued)

OTHER PUBLICATIONS

Office Action and Search Report dated Feb. 7, 2018 for corresponding Taiwan Patent Application No. 106120128.
(Continued)

*Primary Examiner* — Keath T Chen
*Assistant Examiner* — Margaret D Klunk
(74) *Attorney, Agent, or Firm* — Ostrolenk Faber LLP

(57) ABSTRACT

Disclosed is a substrate treating apparatus that treats a substrate with processing liquids. The apparatus includes a substrate holder, an exterior cup, and an interior cup. The interior cup includes an interior cup body, and an interior cup outlet. The exterior cup includes an exterior cup body, an exterior bottom cup, a first drain outlet, a first exhaust port, a second drain outlet, a second exhaust port, and a separation partition. The apparatus further includes an annular member movable upwardly/downwardly, and a drive unit that causes the annular member to move to shift the interior cup body between a collecting position and a retracting position.

35 Claims, 8 Drawing Sheets

(51) Int. Cl.
- *G03D 3/06* (2006.01)
- *G03F 7/16* (2006.01)
- *G03F 7/30* (2006.01)
- *G03F 7/32* (2006.01)

(52) U.S. Cl.
CPC ......... *G03F 7/3021* (2013.01); *G03F 7/3092* (2013.01); *G03F 7/322* (2013.01); *G03F 7/325* (2013.01); *H01L 21/302* (2013.01); *H01L 21/67051* (2013.01); *H01L 21/67057* (2013.01); *H01L 21/67265* (2013.01); *H01L 21/6704* (2013.01)

(56) References Cited

U.S. PATENT DOCUMENTS

| | | | |
|---|---|---|---|
| 2007/0289528 A1 | 12/2007 | Nanba et al. | 118/52 |
| 2008/0070418 A1* | 3/2008 | Miyagi | H01L 21/67051 438/745 |
| 2009/0084409 A1* | 4/2009 | Okura | B08B 3/02 134/21 |
| 2011/0297192 A1 | 12/2011 | Ogata et al. | 134/94.1 |
| 2012/0260946 A1 | 10/2012 | Ogata et al. | 134/18 |
| 2013/0092195 A1 | 4/2013 | Takimoto | 134/26 |
| 2015/0059642 A1* | 3/2015 | Furuya | H01L 21/67028 118/52 |
| 2015/0187613 A1* | 7/2015 | Wakiyama | H01L 21/67051 134/95.1 |

FOREIGN PATENT DOCUMENTS

| | | |
|---|---|---|
| JP | 2001-212493 A | 8/2001 |
| JP | 2001-267278 A | 9/2001 |
| JP | 2007-088398 A | 4/2007 |
| JP | 2007-180379 A | 7/2007 |
| JP | 2008-098594 A | 4/2008 |
| JP | 2011-181808 A | 9/2011 |
| JP | 2012-015348 A | 1/2012 |
| JP | 2012-227285 A | 11/2012 |
| JP | 2014-075575 A | 4/2014 |
| KR | 10-2011-0100136 A | 9/2011 |
| KR | 10-2013-0040155 | 4/2013 |
| TW | 200807540 A | 2/2008 |
| TW | 201215458 A1 | 4/2012 |

OTHER PUBLICATIONS

Notice of Allowance dated Oct. 27, 2020 for corresponding Japanese Patent Application No. 2016-145503.

* cited by examiner

SUBSTRATE TREATING APPARATUS

TECHNICAL FIELD

The present invention relates to a substrate treating apparatus that supplies processing liquids to semiconductor wafers, liquid crystal display substrates, plasma display substrates, organic electroluminescent (EL) substrates, field emission display (FED) substrates, optical display substrates, magnetic disc substrates, optical magnetic disc substrates, photomask substrates, and solar cell substrates (hereinafter, simply referred to as substrates). More particularly, the present invention is directed to a technique about cups for collecting the processing liquids.

BACKGROUND ART

Examples of such currently-used apparatus as above include a substrate treatment apparatus having a substrate holding part, a rotary drive mechanism, a first nozzle, a second nozzle, a cup body, a first drain pipeline, a second drain pipeline, an exhaust pipeline, and a movable cup. See, for example, Japanese Unexamined Patent Publication No. 2014-75575A.

The substrate holding part horizontally holds a substrate. The rotary drive mechanism rotates the substrate holding part around a vertical axis. The first nozzle supplies a developing solution for positive tone development. The second nozzle supplies a developing solution for negative tone development. The cup body surrounds the substrate held with the substrate holding part, and collects the developing solution supplied to the substrate. The first and second drain pipelines are each connected to the cup body. The movable cup moves upwardly/downwardly inside the cup body, thereby introducing the developing solution to either the first or second drain pipeline.

When the first nozzle supplies the developing solution, the movable cup introduces the developing solution to the first drain pipeline. When the second nozzle supplies the developing solution, the movable cup introduces the developing solution to the second drain pipeline. The first drain pipeline drains the developing solution for positive tone development, whereas the second drain pipeline drains the developing solution for negative tone development. Meanwhile, the exhaust pipeline exhausts gas with mist of the developing solution inside the cup body. Accordingly, the first and second drain pipelines allow elimination of mixture of the developing solutions for positive tone development and negative tone development. Here, the exhaust pipeline exhausts gas with the mist of the developing solution inside the cup body when the first and second nozzles each supply the developing solution.

SUMMARY OF INVENTION

Technical Problem

However, the example of the currently-used apparatus with such a construction possesses the following drawback. That is, the currently-used apparatus is composed of a single exhaust pipeline. Accordingly, the mist of both the developing solutions for the positive tone development and the negative tone development inside the cup body is exhausted through the same exhaust pipeline. Therefore, mixture of mist of different types of developing solutions is possibly generated within the single exhaust pipeline. This results in difficulty in maintaining a clean atmosphere within the cup, leading to some trouble in high-quality treatment to substrates.

Solution to Problem

The present invention has been made regarding the state of the art noted above, and its one object is to provide a substrate treating apparatus that achieves high-quality treatment to substrates.

In order to accomplish the above object, the present invention adopts the following construction. One aspect of the present invention provides a substrate treating apparatus that treats a substrate with processing liquids. The apparatus includes a substrate holder that holds a substrate horizontally, a rotary drive unit that rotates the substrate holder around a vertical axis, a first processing liquid supplying part that supplies a first processing liquid of the processing liquids to the substrate held with the substrate holder, a second processing liquid supplying part that supplies a second processing liquid of the processing liquids to the substrate held with the substrate holder, an exterior cup surrounding a lateral side of the substrate holder, and an interior cup disposed between the substrate holder and the exterior cup. The interior cup includes an interior cup body having an annular shape in plan view, an interior cup outlet that is disposed on a lower portion of the interior cup body and discharges the first processing liquid and gas within the interior cup body. The exterior cup includes an exterior cup body having an annular shape in plan view, an exterior bottom cup that forms a bottom of the exterior cup body, a first drain outlet that is formed in a bottom face of the exterior bottom cup and drains the first processing liquid from the interior cup outlet, a first exhaust port that is formed in the exterior bottom cup and exhausts the gas from the interior cup outlet, a second drain outlet formed in the bottom face of the exterior bottom cup and drains the second processing liquid within the exterior cup body, a second exhaust port that is formed in the exterior bottom cup and exhausts the gas in the exterior cup body, and a separation partition that is erected on the bottom face of the exterior bottom cup in an annular shape in plan view and separates the first drain outlet and the second drain outlet. The apparatus further includes an annular member having an annular shape in plan view, movable upwardly/downwardly along an outer periphery inside the exterior cup body and connected to the interior cup body so as not to close the interior cup outlet; and a drive unit that causes the annular member to move to shift the interior cup body between a collecting position where the interior cup collects the processing liquid and a retracting position where the exterior cup collects the processing liquid.

With the aspect of the present invention, the rotary drive unit causes the substrate holder to rotate along with the substrate while the drive unit causes the annular member to move to remain the interior cup body in the collecting position, whereby the first processing liquid supplying part supplies the first processing liquid to the substrate. Under such a condition, the first processing liquid scattering around the substrate is collected in the interior cup body of the interior cup, and then flows through the interior cup outlet to be collected on the bottom face of the exterior cup. The first processing liquid that is collected on the bottom face formed in the exterior cup body of the exterior cup is drained through the first drain outlet that is separated from the second drain outlet at the bottom face by the separation partition. The gas within the interior cup that contains the mist of the first processing liquid is collected from the interior cup body through the interior cup outlet into the exterior cup, and is exhausted through the first outlet of the exterior bottom cup. In addition, the second processing liquid supplying part supplies the second processing liquid to the substrate while the drive unit causes the annular member to move to shift the interior cup body into the retracting position. Under such a condition, the second processing liquid scattering around the substrate is collected in the exterior cup body of the exterior cup and then on the bottom face of the exterior bottom cup. The second processing liquid collected on the bottom face of the exterior cup body is drained through the second drain outlet separated from the first drain outlet at the bottom face by the separation partition. The gas within the exterior cup that contains the mist of the second processing liquid is collected in the exterior cup, and is drained through the second exhaust port of the exterior bottom cup. The drive unit moves the annular member upwardly/downwardly to shift the interior cup into the collecting position/retracting position. Accordingly, the first processing liquid is drained through the first drain outlet, and the gas containing the mist of the first processing liquid is exhausted through the first exhaust port. In addition, the second processing liquid is drained through the second drain outlet, and the gas containing the mist of the second processing liquid is exhausted through the second exhaust port. This generates no mixture of the gas within the interior cup and the gas within the exterior cup, leading to high-quality treatment to the substrate in use of both the interior cup and the exterior cup. Moreover, the interior cup body includes no bottom face, leading to reduction in weight of the interior cup. Therefore, suppressed load is obtainable when the drive unit shifts the interior cup body via the annular member, achieving rapid shift of the interior cup body. Moreover, the first processing liquid is also collected on the bottom face of the exterior bottom cup disposed therebelow, leading to avoidance of adverse effects cause by splattering of the first processing liquid.

It is preferred in the aspect of the present invention that the annular member includes connecting parts that connect the interior cup body at a plurality of points located at an equal angular interval in plan view.

The annular member is connected to the interior cup body via the connecting parts located at the equal angular interval in plan view. Accordingly, movement of the interior cup body in a stable attitude is obtainable even in rapid upwardly/downwardly movement of the annular member by the drive unit. This achieves rapid switching of treatments.

It is preferred in the aspect of the present invention that the interior cup body includes a guiding unit that guides downwardly the first processing liquid scattering around the substrate, and a partition accommodating part on a lower portion of the guiding unit that is formed in an inverted U-shape, and that the interior cup body accommodates the separation partition into the partition accommodating part in the retracting position, and accommodates only an upper portion of the separation partition into the partition accommodating part in the collecting position.

The partition accommodating part of the interior cup body accommodates the separation partition in the retracting position, and accommodates only the upper portion of the separation partition in the collecting position. Accordingly, even when both of the interior cup and the exterior cup commonly use the exterior bottom cup, an interior of the interior cup body is completely separated from an interior of the exterior bottom cup. Therefore, the exterior cup allows collection of only the second processing liquid and the gas containing the mist of the second processing liquid, and allows collection of the first processing liquid and the gas containing the mist thereof only into the interior cup while guidance with the guiding unit. In addition, the partition accommodating part and the separation partition serve as guidance, achieving stable upwardly/downwardly movement of the interior cup body.

It is preferred in the aspect of the present invention that the first exhaust port has an opening at a front end of a hollow portion thereof that extends upwardly from the bottom face of the exterior bottom cup.

The opening of the first exhaust port is spaced upwardly from the bottom face of the exterior bottom cup. Accordingly, this prevents mixture of the first processing liquid and the gas collected on the bottom face.

It is preferred in the aspect of the present invention that the exterior cup body includes a middle cup on an inner periphery side relative to the separation partition, and the middle cup has an undersurface that is spaced away from the opening of the first exhaust port, and an outer periphery that is spaced away from an inner periphery of the separation partition and whose edge is spaced away from the bottom face of the exterior cup body.

Accordingly, the middle cup allows prevention of the first processing liquid from flowing into the first exhaust port. This achieves exhaust of the gas within the interior cup with high degrees of gas-liquid separation.

It is preferred in the aspect of the present invention that the exterior bottom cup is inclined a slope at the bottom face that inclines downwardly to the first drain outlet and the second drain outlet in its circumferential direction.

The slope allows the first processing liquid and the second processing liquid that flow downwardly to areas away from the first drain outlet and the second drain outlet on the bottom face of the exterior bottom cup to flow downwardly into the first drain outlet and the second drain outlet, respectively. This allows enhanced collection efficiency of the first and second processing liquids.

Another aspect of the present invention provides a substrate treating apparatus that treats a substrate with processing liquids. The apparatus includes a substrate holder that holds a substrate horizontally, a rotary drive unit that rotates the substrate holder around a vertical axis, a first processing liquid supplying part that supplies a first processing liquid of the processing liquids to the substrate held with the substrate holder, a second processing liquid supplying part that supplies a second processing liquid of the processing liquids to the substrate held with the substrate holder, an exterior cup surrounding a lateral side of the substrate holder, and an interior cup disposed between the substrate holder and the exterior cup. The interior cup includes an interior cup body having an annular shape in plan view, an interior cup outlet that is disposed on a lower portion of the interior cup body and discharges the first processing liquid and gas within the interior cup body. The exterior cup includes an exterior cup body having an annular shape in plan view, an exterior bottom cup that forms a bottom of the exterior cup body, a first drain outlet that is formed in a bottom face of the exterior bottom cup and drains the first processing liquid from the interior cup outlet, a first exhaust port that is formed in the exterior bottom cup and exhausts the gas from the interior cup outlet, a second drain outlet formed in the bottom face of the exterior bottom cup and drains the second processing liquid within the exterior cup body, a second exhaust port that is formed in the exterior bottom cup and exhausts the gas in the exterior cup body, and a separation partition that is erected on the bottom face of the exterior bottom cup in an annular shape in plan view and separates the first drain outlet and the second drain outlet. The first exhaust ports are disposed at a plurality of points located at an equal angular interval from the center in plan view, and the interior cup body moves between a collecting position where the interior cup collects the processing liquid and a retracting position where the exterior cup collects the processing liquid.

With the aspect of the present invention, the rotary drive unit causes the substrate holder to rotate along with the substrate while the interior cup body is remained in the collecting position, whereby the first processing liquid supplying part supplies the first processing liquid to the substrate. Under such a condition, the first processing liquid scattering around the substrate is collected in the interior cup body of the interior cup, and then flows through the interior cup outlet to be collected on the bottom face of the exterior cup. The first processing liquid that is collected on the bottom face formed in the exterior cup body of the exterior cup is drained through the first drain outlet that is separated from the second drain outlet at the bottom face by the separation partition. The gas within the interior cup that contains the mist of the first processing liquid is collected from the interior cup body through the interior cup outlet into the exterior cup, and is exhausted through the first outlet of the exterior bottom cup. In addition, the second processing liquid supplying part supplies the second processing liquid to the substrate while the interior cup body is shifted into the retracting position. Under such a condition, the second processing liquid scattering around the substrate is collected in the exterior cup body of the exterior cup and then on the bottom face of the exterior bottom cup. The second processing liquid collected on the bottom face of the exterior cup body is drained through the second drain outlet separated from the first drain outlet at the bottom face by the separation partition. The gas within the exterior cup that contains the mist of the second processing liquid is collected in the exterior cup, and is drained through the second exhaust port of the exterior bottom cup. The interior cup is shifted into the collecting position/retracting position. Accordingly, the first processing liquid is drained through the first drain outlet, and the gas containing the mist of the first processing liquid is exhausted through the first exhaust port. In addition, the second processing liquid is drained through the second drain outlet, and the gas containing the mist of the second processing liquid is exhausted through the second exhaust port. This generates no mixture of the gas within the interior cup and the gas within the exterior cup, leading to high-quality treatment to the substrate in use of both the interior cup and the exterior cup. Moreover, since the first exhaust ports are located in the interior cup at the equal angular interval in plan view, the interior cup allows exhaust of the gas containing the mist of the first processing liquid. Therefore, this achieves an even and uniform atmosphere within the interior cup, obtaining enhanced in-plane consistency for substrate treatment with the first processing liquid.

Another aspect of the present invention provides a substrate treating apparatus that treats a substrate with processing liquids. The apparatus includes a substrate holder that holds a substrate horizontally, a rotary drive unit that rotates the substrate holder around a vertical axis, a first processing liquid supplying part that supplies a first processing liquid of the processing liquids to the substrate held with the substrate holder, a second processing liquid supplying part that supplies a second processing liquid of the processing liquids to the substrate held with the substrate holder, an exterior cup surrounding a lateral side of the substrate holder, and an interior cup disposed between the substrate holder and the exterior cup. The interior cup includes an interior cup body having an annular shape in plan view, an interior cup outlet that is disposed on a lower portion of the interior cup body and discharges the first processing liquid and gas within the interior cup body. The exterior cup includes an exterior cup body having an annular shape in plan view, an exterior bottom cup that forms a bottom of the exterior cup body, a first drain outlet that is formed in a bottom face of the exterior bottom cup and drains the first processing liquid from the interior cup outlet, a first exhaust port that is formed in the exterior bottom cup and exhausts the gas from the interior cup outlet, a second drain outlet formed in the bottom face of the exterior bottom cup and drains the second processing liquid within the exterior cup body, a second exhaust port that is formed in the exterior bottom cup and exhausts the gas in the exterior cup body, and a separation partition that is erected on the bottom face of the exterior bottom cup in an annular shape in plan view and separates the first drain outlet and the second drain outlet. The second exhaust ports are disposed at a plurality of points located at an equal angular interval from the center in plan view, and the interior cup body moves between a collecting position where the interior cup collects the processing liquid and a retracting position where the exterior cup collects the processing liquid.

With the aspect of the present invention, the rotary drive unit causes the substrate holder to rotate along with the substrate while the interior cup body is remained in the collecting position, whereby the first processing liquid supplying part supplies the first processing liquid to the substrate. Under such a condition, the first processing liquid scattering around the substrate is collected in the interior cup body of the interior cup, and then flows through the interior cup outlet to be collected on the bottom face of the exterior cup. The first processing liquid that is collected on the bottom face formed in the exterior cup body of the exterior cup is drained through the first drain outlet that is separated from the second drain outlet at the bottom face by the separation partition. The gas within the interior cup that contains the mist of the first processing liquid is collected from the interior cup body through the interior cup outlet into the exterior cup, and is exhausted through the first outlet of the exterior bottom cup. In addition, the second processing liquid supplying part supplies the second processing liquid to the substrate while the interior cup body is shifted into the retracting position. Under such a condition, the second processing liquid scattering around the substrate is collected in the exterior cup body of the exterior cup and then on the bottom face of the exterior bottom cup. The second processing liquid collected on the bottom face of the exterior cup body is drained through the second drain outlet separated from the first drain outlet at the bottom face by the separation partition. The gas within the exterior cup that contains the mist of the second processing liquid is collected in the exterior cup, and is drained through the second exhaust port of the exterior bottom cup. The interior cup is shifted into the collecting position/retracting position. Accordingly, the first processing liquid is drained through the first drain outlet, and the gas containing the mist of the first processing liquid is exhausted through the first exhaust port. In addition, the second processing liquid is drained through the second drain outlet, and the gas containing the mist of the second processing liquid is exhausted through the second exhaust port. This generates no mixture of the gas within the interior cup and the gas within the exterior cup, leading to high-quality treatment to the substrate in use of both the interior cup and the exterior cup. Moreover, since the second exhaust ports are located in the exterior cup at the equal angular interval in plan view, the exterior cup allows exhaust of the gas containing the mist of the second processing liquid. Therefore, this achieves an even and uniform atmosphere within the exterior cup, obtaining enhanced in-plane consistency for substrate treatment with the second processing liquid.

Another aspect of the present invention provides a substrate treating apparatus that treats a substrate with processing liquids. The apparatus includes a substrate holder that holds a substrate horizontally, a rotary drive unit that rotates the substrate holder around a vertical axis, a first processing liquid supplying part that supplies a first processing liquid of the processing liquids to the substrate held with the substrate holder, a second processing liquid supplying part that supplies a second processing liquid of the processing liquids to the substrate held with the substrate holder, an exterior cup surrounding a lateral side of the substrate holder, and an interior cup disposed between the substrate holder and the exterior cup. The interior cup includes an interior cup body having an annular shape in plan view, an interior cup outlet that is disposed on a lower portion of the interior cup body and discharges the first processing liquid and gas within the interior cup body. The exterior cup includes an exterior cup body having an annular shape in plan view, an exterior bottom cup that forms a bottom of the exterior cup body, a first drain outlet that is formed in a bottom face of the exterior bottom cup and drains the first processing liquid from the interior cup outlet, a first exhaust port that is formed in the exterior bottom cup and exhausts the gas from the interior cup outlet, a second drain outlet formed in the bottom face of the exterior bottom cup and drains the second processing liquid within the exterior cup body, a second exhaust port that is formed in the exterior bottom cup and exhausts the gas in the exterior cup body, and a separation partition that is erected on the bottom face of the exterior bottom cup in an annular shape in plan view and separates the first drain outlet and the second drain outlet. The first exhaust ports are disposed at a plurality of points located at an equal angular interval from the center in plan view, the second exhaust ports are disposed at a plurality of points located at an equal angular interval from the center in plan view, and the interior cup body moves between a collecting position where the interior cup collects the processing liquid and a retracting position where the exterior cup collects the processing liquid.

With the aspect of the present invention, the rotary drive unit causes the substrate holder to rotate along with the substrate while the interior cup body is remained in the collecting position, whereby the first processing liquid supplying part supplies the first processing liquid to the substrate. Under such a condition, the first processing liquid scattering around the substrate is collected in the interior cup body of the interior cup, and then flows through the interior cup outlet to be collected on the bottom face of the exterior cup. The first processing liquid that is collected on the bottom face formed in the exterior cup body of the exterior cup is drained through the first drain outlet that is separated from the second drain outlet at the bottom face by the separation partition. The gas within the interior cup that contains the mist of the first processing liquid is collected from the interior cup body through the interior cup outlet into the exterior cup, and is exhausted through the first outlet of the exterior bottom cup. In addition, the second processing liquid supplying part supplies the second processing liquid to the substrate while the interior cup body is shifted into the retracting position. Under such a condition, the second processing liquid scattering around the substrate is collected in the exterior cup body of the exterior cup and then on the bottom face of the exterior bottom cup. The second processing liquid collected on the bottom face of the exterior cup body is drained through the second drain outlet separated from the first drain outlet at the bottom face by the separation partition. The gas within the exterior cup that contains the mist of the second processing liquid is collected in the exterior cup, and is drained through the second exhaust port of the exterior bottom cup. The interior cup is shifted into the collecting position/retracting position. Accordingly, the first processing liquid is drained through the first drain outlet, and the gas containing the mist of the first processing liquid is exhausted through the first exhaust port. In addition, the second processing liquid is drained through the second drain outlet, and the gas containing the mist of the second processing liquid is exhausted through the second exhaust port. This generates no mixture of the gas within the interior cup and the gas within the exterior cup, leading to high-quality treatment to the substrate in use of both the interior cup and the exterior cup. Moreover, since the first exhaust ports are located in the interior cup at the equal angular interval in plan view, the interior cup allows exhaust of the gas containing the mist of the first processing liquid, and since the second exhaust ports are located in the exterior cup at the equal angular interval in plan view, the exterior cup allows exhaust of the gas containing the mist of the second processing liquid. Therefore, this achieves an even and uniform atmosphere within the exterior and interior cups, obtaining enhanced in-plane consistency for substrate treatment with the first and second processing liquids, respectively.

It is preferred in the aspect of the present invention that the exterior cup body includes a lateral side cup that forms a lateral side face of the exterior bottom cup body, the second exhaust ports are each disposed on an outer periphery of the exterior cup body, the lateral side cup includes through holes formed at positions corresponding to the second exhaust ports, respectively, and the second exhaust ports each include an exhaust pipe whose upper end is above an upper portion of the through hole.

The second exhaust ports are each disposed on the outer periphery of the exterior cup, leading to a sufficient distance from the first exhaust ports. This allows an uncomplicated configuration of exhausting the gas. Moreover, exhaust of airflow through the through holes of the lateral side cup toward the upper end of the exhaust pipe achieves exhaust of only the gas with the mist, thereby leading to prevention of the second processing liquid from entering into the second exhaust port.

It is preferred in the aspect of the present invention that the first exhaust ports are shifted by 90 degrees in plan view from location of the second exhaust ports.

Since the first exhaust ports and the second exhaust ports are able to be spaced away from one another by sufficient intervals, leading to an uncomplicated configuration of the exhaust ports.

It is preferred in the aspect of the present invention that the first exhaust ports each have an opening at a front end of a hollow portion thereof that extends upwardly from the bottom face of the exterior bottom cup.

The opening of the first exhaust port is spaced upwardly from the bottom face of the exterior bottom cup. Accordingly, this prevents mixture of the first processing liquid collected on the bottom face and the gas.

Another aspect of the present invention provides a substrate treating apparatus that treats a substrate with processing liquids. The apparatus includes a substrate holder that holds a substrate horizontally, a rotary drive unit that rotates the substrate holder around a vertical axis, a first processing liquid supplying part that supplies a first processing liquid of the processing liquids to the substrate held with the substrate holder, a second processing liquid supplying part that supplies a second processing liquid of the processing liquids to the substrate held with the substrate holder, an exterior cup surrounding a lateral side of the substrate holder, and an interior cup disposed between the substrate holder and the exterior cup. The interior cup includes an interior cup body having an annular shape in plan view, an interior cup outlet that is disposed on a lower portion of the interior cup body and discharges the first processing liquid and gas within the interior cup body. The exterior cup includes an exterior cup body having an annular shape in plan view, an exterior bottom cup that forms a bottom of the exterior cup body, a first drain outlet that is formed in a bottom face of the exterior bottom cup and drains the first processing liquid from the interior cup outlet, a first exhaust port formed in the exterior bottom cup and forming an opening at an upper portion of a hollow part extending upwardly from the bottom face such that the opening is directed to an opposite direction relative to a rotation direction of the substrate holder for exhausting the gas from the interior cup outlet, a second drain outlet formed in the bottom face of the exterior bottom cup and drains the second processing liquid within the exterior cup body, a second exhaust port that is formed in the exterior bottom cup and exhausts the gas in the exterior cup body, and a separation partition that is erected on the bottom face of the exterior bottom cup in an annular shape in plan view and separates the first drain outlet and the second drain outlet. The interior cup body moves between a collecting position where the interior cup collects the processing liquid and a retracting position where the exterior cup collects the processing liquid.

With the aspect of the present invention, the rotary drive unit causes the substrate holder to rotate along with the substrate while the interior cup body is remained in the collecting position, whereby the first processing liquid supplying part supplies the first processing liquid to the substrate. Under such a condition, the first processing liquid scattering around the substrate is collected in the interior cup body of the interior cup, and then flows through the interior cup outlet to be collected on the bottom face of the exterior cup. The first processing liquid that is collected on the bottom face formed in the exterior cup body of the exterior cup is drained through the first drain outlet that is separated from the second drain outlet at the bottom face by the separation partition. The gas within the interior cup that contains the mist of the first processing liquid is collected from the interior cup body through the interior cup outlet into the exterior cup, and is exhausted through the first outlet of the exterior bottom cup. In addition, the second processing liquid supplying part supplies the second processing liquid to the substrate while the interior cup body is shifted into the retracting position. Under such a condition, the second processing liquid scattering around the substrate is collected in the exterior cup body of the exterior cup and then on the bottom face of the exterior bottom cup. The second processing liquid collected on the bottom face of the exterior cup body is drained through the second drain outlet separated from the first drain outlet at the bottom face by the separation partition. The gas within the exterior cup that contains the mist of the second processing liquid is collected in the exterior cup, and is drained through the second exhaust port of the exterior bottom cup. The interior cup is shifted into the collecting position/retracting position. Accordingly, the first processing liquid is drained through the first drain outlet, and the gas containing the mist of the first processing liquid is exhausted through the first exhaust port. In addition, the second processing liquid is drained through the second drain outlet, and the gas containing the mist of the second processing liquid is exhausted through the second exhaust port. This generates no mixture of the gas within the interior cup and the gas within the exterior cup, leading to high-quality treatment to the substrate in use of both the interior cup and the exterior cup. The first exhaust port forms the opening in the direction opposite relative to airflow caused by the rotation of the substrate holder, leading to prevention of the first processing liquid from flowing into the first exhaust port along with the airflow. Therefore, this achieves high degrees of gas-liquid separation.

Another aspect of the present invention provides a substrate treating apparatus that treats a substrate with processing liquids. The apparatus includes a substrate holder that holds a substrate horizontally, a rotary drive unit that rotates the substrate holder around a vertical axis, a first processing liquid supplying part that supplies a first processing liquid of the processing liquids to the substrate held with the substrate holder, a second processing liquid supplying part that supplies a second processing liquid of the processing liquids to the substrate held with the substrate holder, an exterior cup surrounding a lateral side of the substrate holder, and an interior cup disposed between the substrate holder and the exterior cup. The interior cup includes an interior cup body having an annular shape in plan view, an interior cup outlet that is disposed on a lower portion of the interior cup body and discharges the first processing liquid and gas within the interior cup body. The exterior cup includes an exterior cup body having an annular shape in plan view, an exterior bottom cup that forms a bottom of the exterior cup body, a first drain outlet that is formed in a bottom face of the exterior bottom cup and drains the first processing liquid from the interior cup outlet, a first exhaust port that is formed in the exterior bottom cup and exhausts the gas from the interior cup outlet, a second drain outlet formed in the bottom face of the exterior bottom cup and drains the second processing liquid within the exterior cup body, a second exhaust port that is formed in the exterior bottom cup and exhausts the gas in the exterior cup body, and a separation partition that is erected on the bottom face of the exterior bottom cup in an annular shape in plan view and separates the first drain outlet and the second drain outlet. The interior cup body moves between a collecting position where the interior cup collects the processing liquid and a retracting position where the exterior cup collects the processing liquid. The bottom face of the exterior bottom cup includes an inner periphery slope gradually inclined from an inner periphery side relative to the first drain outlet and an outer periphery slope gradually inclined from an outer periphery side relative to the first drain outlet.

With the aspect of the present invention, the rotary drive unit causes the substrate holder to rotate along with the substrate while the interior cup body is remained in the collecting position, whereby the first processing liquid supplying part supplies the first processing liquid to the substrate. Under such a condition, the first processing liquid scattering around the substrate is collected in the interior cup body of the interior cup, and then flows through the interior cup outlet to be collected on the bottom face of the exterior cup. The first processing liquid that is collected on the bottom face formed in the exterior cup body of the exterior cup is drained through the first drain outlet that is separated from the second drain outlet at the bottom face by the separation partition. The gas within the interior cup that contains the mist of the first processing liquid is collected from the interior cup body through the interior cup outlet into the exterior cup, and is exhausted through the first outlet of the exterior bottom cup. In addition, the second processing liquid supplying part supplies the second processing liquid to the substrate while the interior cup body is shifted into the retracting position. Under such a condition, the second processing liquid scattering around the substrate is collected in the exterior cup body of the exterior cup and then on the bottom face of the exterior bottom cup. The second processing liquid collected on the bottom face of the exterior cup body is drained through the second drain outlet separated from the first drain outlet at the bottom face by the separation partition. The gas within the exterior cup that contains the mist of the second processing liquid is collected in the exterior cup, and is drained through the second exhaust port of the exterior bottom cup. The interior cup is shifted into the collecting position/retracting position. Accordingly, the first processing liquid is drained through the first drain outlet, and the gas containing the mist of the first processing liquid is exhausted through the first exhaust port. In addition, the second processing liquid is drained through the second drain outlet, and the gas containing the mist of the second processing liquid is exhausted through the second exhaust port. This generates no mixture of the gas within the interior cup and the gas within the exterior cup, leading to high-quality treatment to the substrate in use of both the interior cup and the exterior cup. In addition, the exterior bottom cup includes the inner periphery slope and the outer periphery slope at the bottom face thereof. Accordingly, this enhances exhaust efficiency of the first processing liquid at the first drain outlet. Moreover, the bottom face of the exterior bottom cup includes the slopes, leading to avoidance of drawbacks such as cause by splattering of the first processing liquid, having flown downwardly from the above, against the bottom face to cause adhesion of the first processing liquid to the substrate.

It is preferred in the aspect of the present invention that the bottom face of the exterior bottom cup includes an inner periphery slope that is gradually inclined downwardly from an inner periphery side relative to the first drain outlet toward the first drain outlet, and an outer periphery slope that is gradually inclined downwardly from an outer periphery side relative to the first drain outlet toward the first drain outlet.

Since the exterior bottom cup includes the inner periphery slope and the outer periphery slope at the bottom face thereof. Accordingly, this enhances exhaust efficiency of the first processing liquid to the first drain outlet. Moreover, the bottom face of the exterior bottom cup includes the slopes, leading to avoidance of drawbacks such as caused by splattering of the first processing liquid, having flown downwardly from the above, against the bottom face to cause adhesion of the first processing liquid to the substrate.

It is preferred in the aspect of the present invention that the first exhaust ports are each formed in the exterior bottom cup and include an opening at an upper portion of a hollow part extending upwardly from the bottom face such that the opening is directed to an opposite direction relative to a rotation direction of the substrate holder.

The first exhaust port includes the opening in the direction opposite relative to that of airflow caused by the rotation of the substrate holder, leading to prevention of the first processing liquid from flowing into the first exhaust port along with the airflow. Therefore, this achieves high degrees of gas-liquid separation.

It is preferred in the aspect of the present invention that the bottom face of the exterior bottom cup undergoes a hydrophilic treatment.

Since the bottom face of the exterior bottom cup undergoes the hydrophilic treatment, the first processing liquid and the second processing liquid are unlikely to splatter against the bottom face even upon flowing downwardly. Accordingly, this achieves avoidance of drawbacks such as caused by splattering of the second processing liquid upwardly against the bottom face to cause adhesion of the second processing liquid to the substrate. This also enhances circumferential fluidity of the first processing liquid and the second processing liquid at the bottom face, leading to convenient collection at the first drain outlet and the second drain outlet.

It is preferred in the aspect of the present invention that the middle cup undergoes a hydrophilic treatment.

This causes the first processing liquid to be unlikely to splatter even upon flowing downwardly into the middle cup. Therefore, such drawback is avoidable as caused by splattering of the first processing liquid against the middle cup to cause adhesion of the first processing liquid to the substrate. Moreover, this obtains enhanced fluidity of the first processing liquid adhering to the middle cup, leading to convenient collection at the first drain outlet. Moreover, the second processing liquid adhering to the middle cup is readily flown downwardly into the exterior bottom cup while the exterior cup collects the second processing liquid, leading to convenient collection at the second drain outlet.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

The following describes one embodiment of the present invention with reference to drawings.

Figure 1:
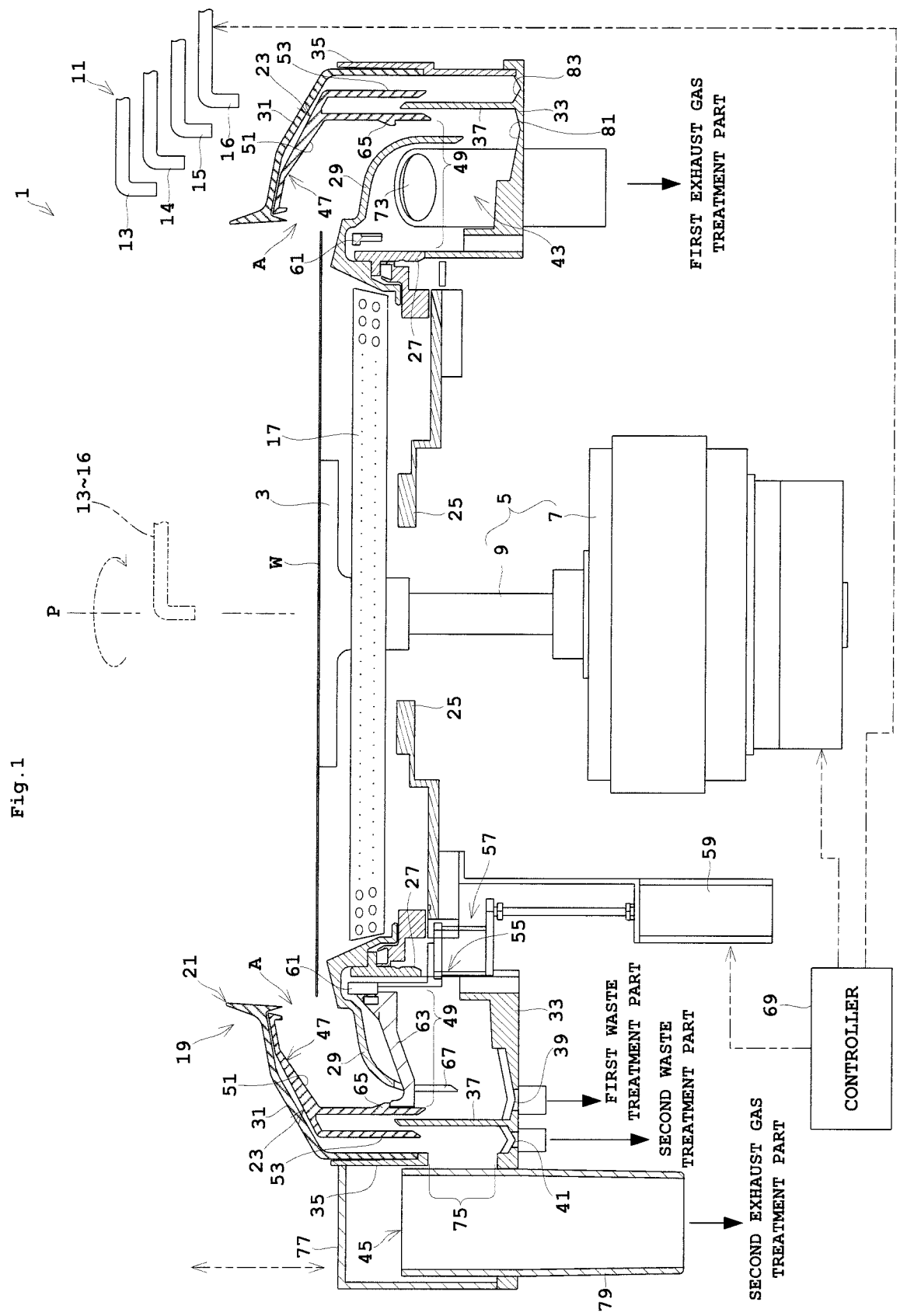
FIG. 1 schematically illustrates an overall configuration in a longitudinal sectional view of a substrate treating apparatus according to one embodiment of the present invention in which an interior cup is in its collecting position.
Figure 2:
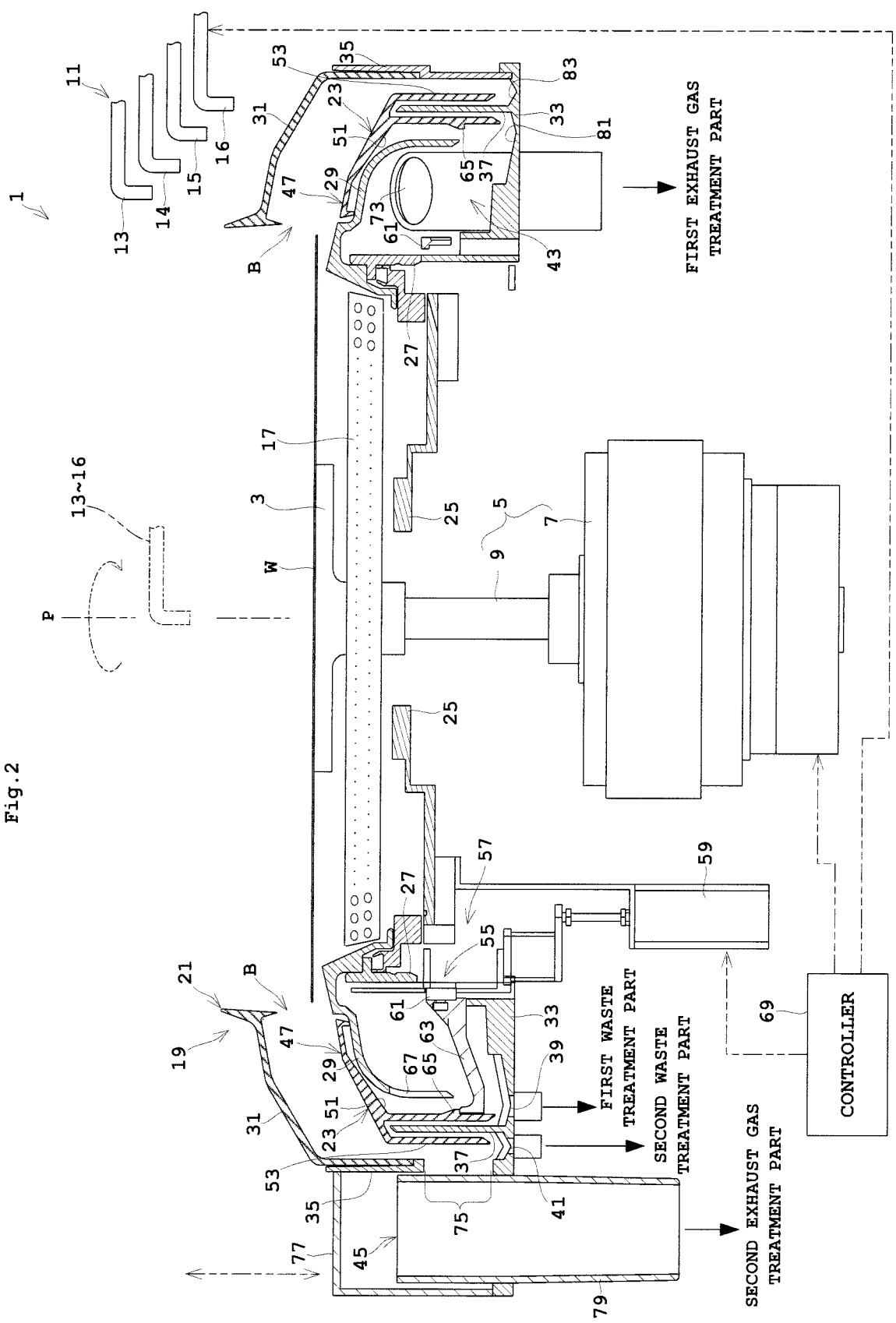
FIG. 2 schematically illustrates an overall configuration in a longitudinal sectional view of the substrate treating apparatus according to the embodiment of the present invention in which the interior cup is in its retracting position.
Figure 3:
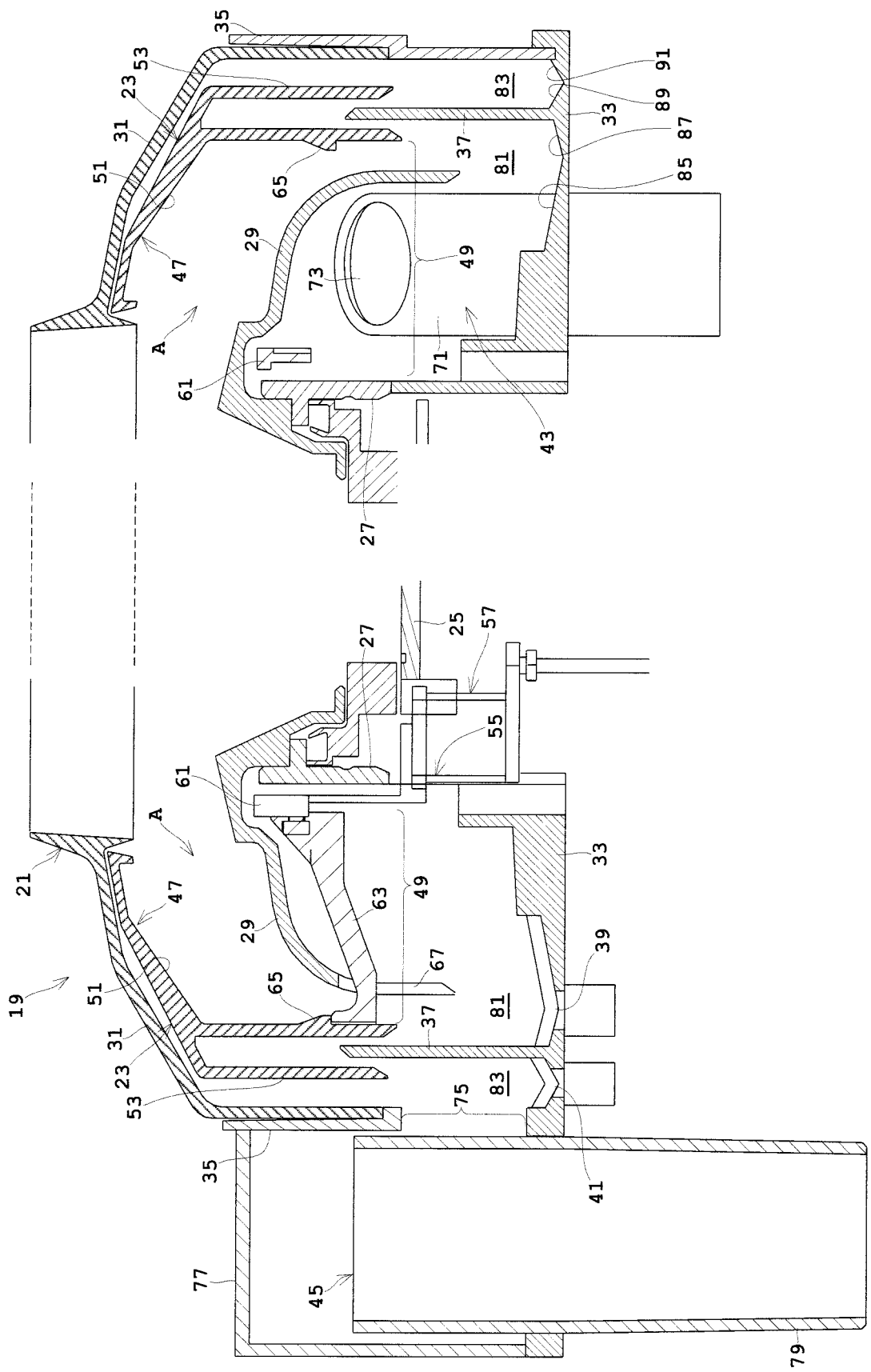
FIG. 3 is a longitudinal sectional view having a partially scale-up interior cup in its collecting position.
Figure 4:
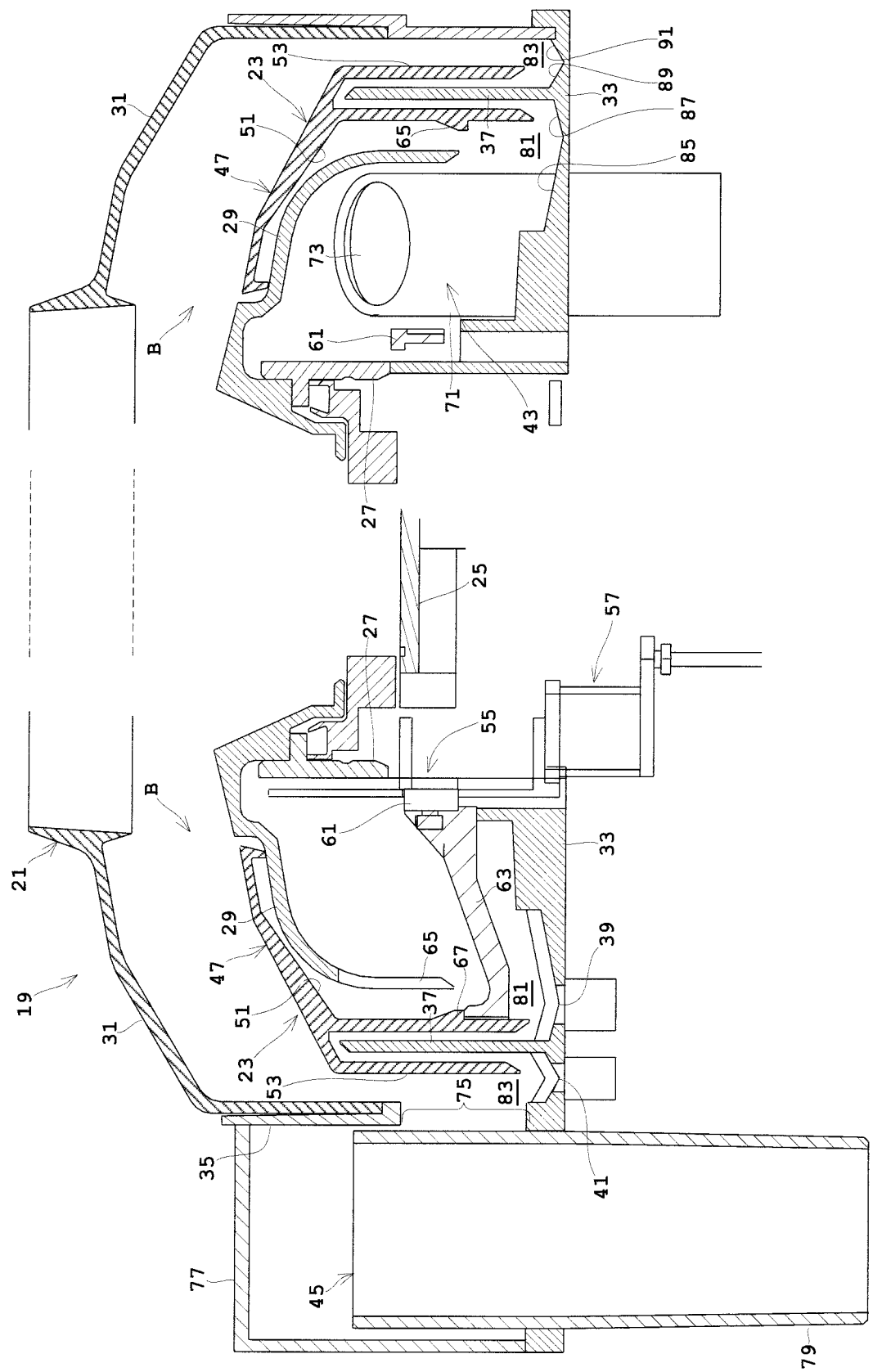
FIG. 4 is a longitudinal sectional view having a partially scale-up interior cup in its collecting retracting position.

FIG. 1 schematically illustrates an overall configuration in a longitudinal sectional view of a substrate treating apparatus according to one embodiment of the present invention in which an interior cup is in its collecting position. FIG. 2 schematically illustrates an overall configuration in a longitudinal sectional view of the substrate treating apparatus according to the embodiment of the present invention in which the interior cup is in its retracting position. Moreover, FIG. 3 is a longitudinal sectional view having a partially scale-up interior cup in its collecting position. FIG. 4 is a longitudinal sectional view having a partially scale-up interior cup in its collecting retracting position.

A substrate treating apparatus 1 according to one embodiment of the present embodiment supplies processing liquids to every one substrate W (e.g., a semiconductor wafer having a circular shape in plan view) and successively performs treatment to the substrate W. Specifically, the substrate treating apparatus allows performance of both negative tone development and positive tone development to the substrate W.

A substrate holder 3 holds the substrate W horizontally. The substrate holder 3 suction-holds the center on an undersurface of the substrate W through vacuum suction. Note that another type of mechanism different from the suction-hold type is adoptable for holding the substrate W.

The rotary drive unit 5 includes an electric motor 7 and a rotary shaft 9. The rotary shaft 9 is connected to the electric motor 7 at its lower end, and is connected to a lower end of the substrate holder 3 at its upper end. Accordingly, driving the electric motor 7 causes the rotary shaft 9 to rotate around an axis P and causes the substrate W to rotate in a horizontal plane.

The processing liquid supplying part 11 supplies various types of processing liquids. The processing liquid supplying part 11 includes four nozzles 13 to 16, for example. For instance, the nozzle 13 supplies a developing solution for positive tone development as a processing liquid, and the nozzle 14 supplies a rinse liquid for positive tone development as a processing liquid. Moreover, the nozzle 15 supplies a developing solution for negative tone development as a processing liquid, and the nozzle 16 supplies a rinse liquid for negative tone development as a processing liquid.

Here, the developing solution for positive tone development is, for example, an alkaline developing solution such as tetra methyl ammonium hydroxide (TMAH). The rinse liquid for positive tone development is, for example, deionized water. The developing solution for negative tone development is, for example a developing solution containing an organic solvent such as butyl acetate. The rinse liquid for negative tone development contains, for example, an organic solvent such as 4-Methyl-2-pentanol (MIBC: Methyl Iso Butyl Carbinol).

The developing solution and the rinse liquid for the positive tone development mentioned above correspond to the "first processing liquid" in the present invention. The developing solution and the rinse liquid for negative tone development mentioned above correspond to the "second processing liquid" in the present invention.

A spray disk 17 is provided below the substrate holder 3. The spray disk 17 is attached to the substrate holder 3 so as to rotate integrally with the substrate holder 3. The spray disk 17 supplies a cleaning liquid from a cleaning liquid supplying part, not shown, to a cup 19 mentioned later for cleaning an interior plane of the cup 19. Here, the detailed description of the spray disk 17 is to be omitted.

The cup 19 surrounds the substrate holder 3 laterally to collect the processing liquids supplied to the substrate W. The cup 19 includes an exterior cup 21 and an interior cup 23. The interior cup 23 is disposed between the substrate holder 3 and the exterior cup 21. The interior cup 23 includes an inlet A on its inner periphery side (adjacent to the rotary shaft 9) as illustrated in FIGS. 1 and 3 for collecting the processing liquids, and the exterior cup 21 includes an inlet B on its inner periphery side as illustrated in FIGS. 2 and 4 for collecting the processing liquids.

The cup 19 includes a base 25 on an outer periphery side of the rotary shaft 9. A side plate 27 is provided on an outer periphery of the base 25 around below an outer edge of the substrate W that is held with the substrate holder 3. A lifting mechanism (not shown) causes the cup 19 and the base 25 to move vertically relative to the substrate holder 3. This achieves a switch between a condition in which the substrate holder 3 protrudes above the upper end of the cup 19 for deliver to/from a substrate transport mechanism (not shown) and a condition as in FIGS. 1 and 2 in which a treatment is performable.

The exterior cup 21 is disposed furthest from the side plate 27, and the interior cup 23 is disposed inside of the exterior cup 21. Moreover, a middle cup 29 is disposed inside of the interior cup 23.

The exterior cup 21 includes an exterior cup body 31, an exterior bottom cup 33, and a lateral side cup 35. The exterior cup body 31 is annular in plan view. The exterior bottom cup 33 forms a bottom of the exterior cup body 31.

The exterior bottom cup 33 includes a separation partition 37 erected thereon on the bottom face. The separation partition 37 is annular in plan view, and separates the bottom face of the exterior bottom cup 33 into two portions, i.e., an inner periphery side and an outer periphery side. The bottom face on the inner periphery side has a first drain outlet 39 formed therein, and the bottom face on the outer periphery side has a second drain outlet 41 formed therein. The first drain outlet 39 is in communication with a first waste treatment part, and the second drain outlet 41 is in communication with a second waste treatment part. Moreover, the exterior bottom cup 33 has a first exhaust port 43 formed on the inner periphery side, and a second exhaust port 45 outside of the lateral side cup 35 of the exterior bottom cup 33. The first exhaust port 43 is in communication with a first exhaust gas treatment part, and the second exhaust port 45 is in communication with a second exhaust gas treatment part.

An interior cup body 47 is disposed interior of the exterior cup body 31 above the exterior bottom cup 33. The interior cup body 47 is annular in plan view. The interior cup body 47 forms an interior cup outlet 49 that has no bottom and discharges the processing liquids and the gas downwardly. The interior cup body 47 includes a guiding unit 51 and a partition accommodating part 53. The guiding unit 51 guides the developing solution and the rinse liquid for positive tone development scattering around from the substrate W to the interior cup outlet 49 below. The partition accommodating part 53 is formed on a lower portion of the guiding unit 51, and has an inverted U-shape in cross sectional view. The partition accommodating part 53 accommodates the separation partition 37. Specifically, the partition accommodating part 53 accommodates the separation partition 37 or only an upper portion of the separation partition 37 selectively depending on operations mentioned later.

The middle cup 29 is positioned such that its outer periphery is located toward inside from the separation partition 37. The middle cup 29 has an undersurface that is spaced away from an opening of the first exhaust port 43, an outer periphery spaced inwardly from an inner periphery of the separation partition 37, and an outer edge spaced away from the bottom face of the exterior bottom cup 33. The middle cup 29 undergoes a hydrophilic treatment. Accordingly, this allows smooth guidance of the developing solution and the rinse liquid for positive tone development scattering around from the substrate W to the bottom face of the exterior bottom cup 33 with the guiding unit 51. Here, it is preferred that the hydrophilic treatment is performed not through application of an agent and the like, but through roughing a surface with sandblasting.

The hydrophilic treatment to the middle cup 29 allows the developing solution and the rinse liquid for positive tone development to be unlikely to splatter upon flowing downwardly to the middle cup 29. Accordingly, such drawback is avoidable as caused by splattering of the developing solution and the rinse liquid for positive tone development against the middle cup 29 to cause adhesion to the substrate W. Moreover, this achieves enhanced fluidity of the developing solution and the rinse liquid for positive tone development adhering to the middle cup 29, leading to convenient collection at the first drain outlet 39.

It is preferred that the interior cup body 47 also undergoes hydrophilic treatment. This allows the developing solution and the rinse liquid for negative tone development adhering to the top face of the interior cup body 47 to be likely to flow downwardly to the exterior bottom cup 33 to be collected at the second drain outlet 41 while the exterior cup 21 collects the developing solution and the rinse liquid for negative tone development.

The side plate 27 has a notch 55 on one site (on the left in FIGS. 1 to 4) that is elongated in a height direction and passes from the inner periphery side to the outer periphery side. A linkage 57 and an air cylinder 59 are provided on the inner periphery side of the notch 55. The air cylinder 59 is attached to the base 25 while its operational segment is directed vertically. The air cylinder 59 has a front end connected to the bottom of the linkage 57. An annular member 61 is disposed on an outer periphery of the side plate 27.

Here, the air cylinder 59 mentioned above corresponds to the "drive unit" in the present invention.

Figure 5:
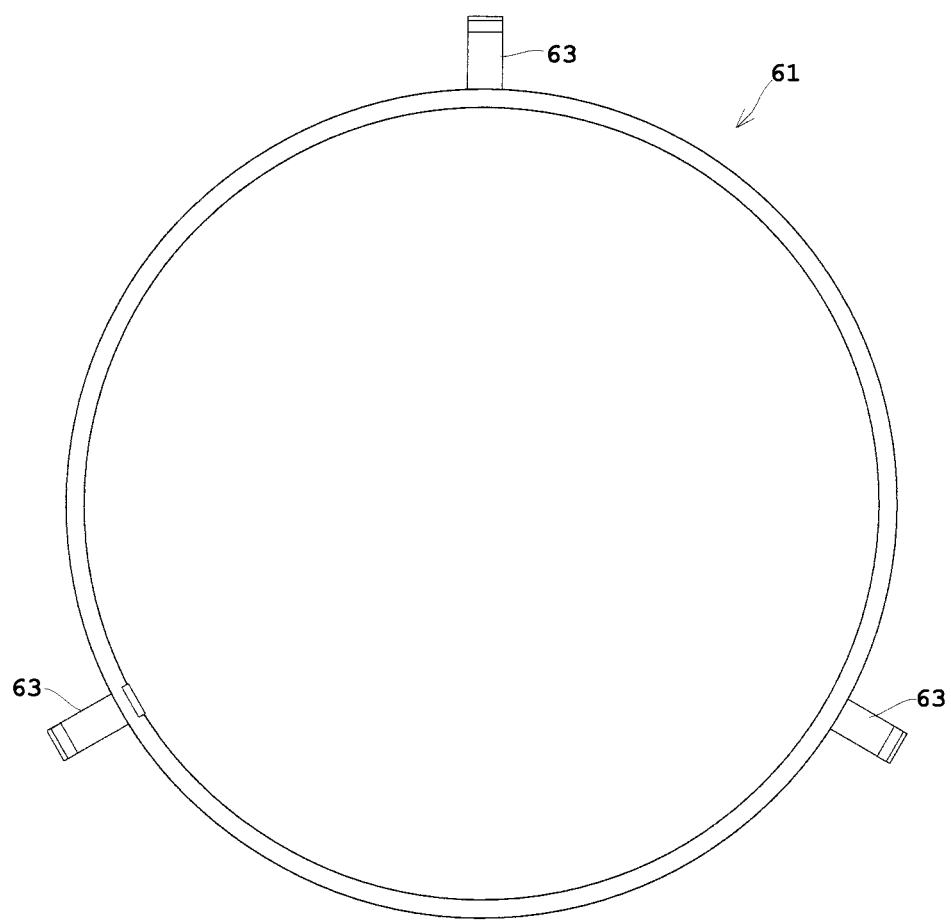
FIG. 5 is a plan view of an annular member.

Now reference is made to FIG. 5. FIG. 5 is a plan view of the annular member.

The annular member 61 is annular in plan view, and is attached so as to move upwardly/downwardly along an outer periphery of the side plate 27, corresponding to the outer periphery within the exterior cup body 31, slightly away outwardly from the outer periphery. The annular member 61 includes connecting parts 63 at three points on its outer periphery that each extend toward the outer periphery side at angles at which a distance from the center is equal to one another in plan view. The connecting parts 63 engage in protruding portions 65 individually formed on the inner periphery of the interior cup body 47. The connecting parts 63 are connected to the protruding portions 65 through vertical openings 67 in the middle cup 29. As a result, no interference occurs between the middle cup 29 and the connecting parts 63.

In such a manner, the annular member 61 is connected to the interior cup body 47 at three connecting parts 63 at equal angular intervals in plan view. Accordingly, the interior cup body 47 is movable in a stable attitude even when the annular member 61 is rapidly moved upwardly/downwardly. This achieves rapid switching of treatments.

The upper portion of the linkage 57 extends upwardly from the notch 55 of the side plate 27 to be connected to one part on the inner periphery of the annular member 61.

Accordingly, when the air cylinder 59 actuates to move the operational segment upwardly/downwardly, the interior cup body 47 moves within the exterior cup 21 along with the annular member 61. Specifically, when the operational segment of the air cylinder 59 expands, the interior cup body 47 moves upwardly into the "collecting position". When the operational segment of the air cylinder 59 retracts, the interior cup body 47 moves downwardly into the "retracting position". Here, the collecting position corresponds to a position where the developing solution and the rinse liquid for positive tone development are collected through the inlet A of the interior cup 23, and the retracting position corresponds to a position where the developing solution and the rinse liquid for negative tone development are collected through the inlet B of the exterior cup 21.

The partition accommodating part 53 of the interior cup body 47 accommodates the separation partition 37 in the retracting position, and accommodates only an upper portion of the separation partition 37 in the collecting position. Accordingly, the inside of the interior cup body 47 is able to be separated from the inside of the exterior bottom cup 33 completely even when the interior cup 23 and the exterior cup 21 share the exterior bottom cup 33. Consequently, the developing solution and the rinse liquid for negative tone development as well as the gas containing the mist thereof are collectable only in the exterior cup 21 in the retracting position, whereas the developing solution and the rinse liquid for positive tone development as well as the gas containing the mist thereof are collectable only in the interior cup 23 while guiding them with the guiding unit 51 in the collecting position. In addition, the partition accommodating part 53 and the separation partition 37 serve as guidance, leading to stable upwardly/downwardly movement of the interior cup body 47.

The electric motor 7, the processing liquid supplying part 11, and the air cylinder 59 are controlled by a controller 69. The controller 69 includes a CPU, a memory, and the like, and operates the above elements in accordance with recipes specifying procedures of treating the substrate W.

Figure 6:
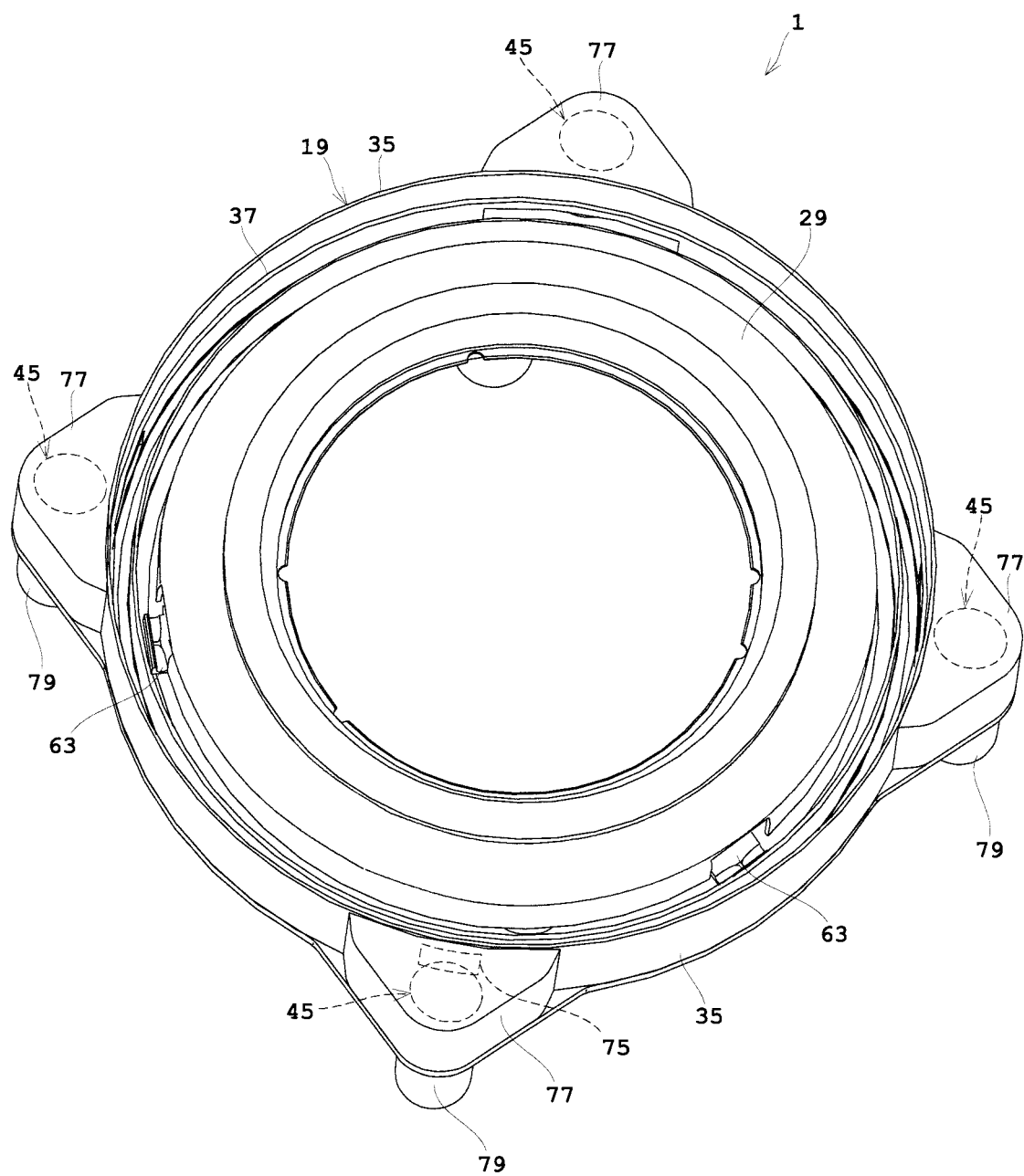
FIG. 6 is a perspective view of an exterior bottom cup with an exterior cup body and an interior cup body removed therefrom.
Figure 7:
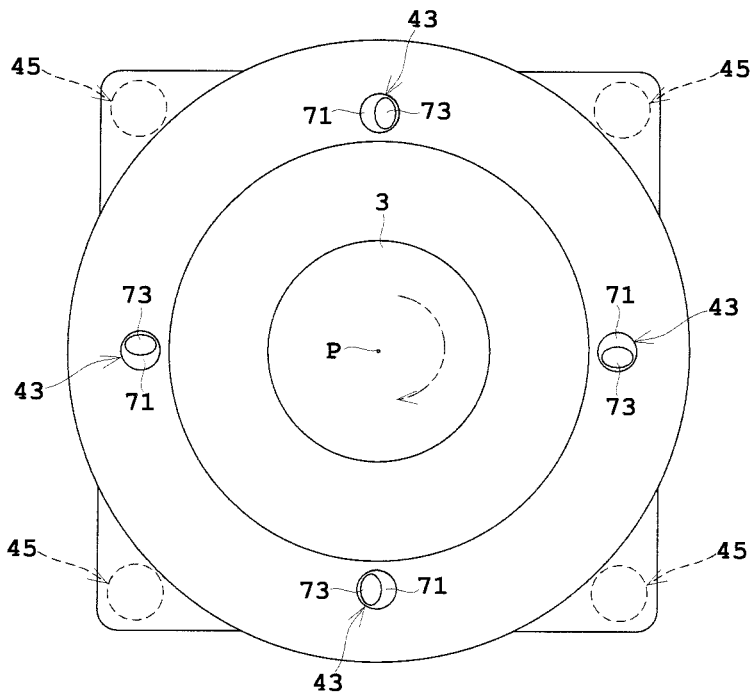
FIG. 7 is a plan view illustrating a positional relationship of exhaust ports.
Figure 8:
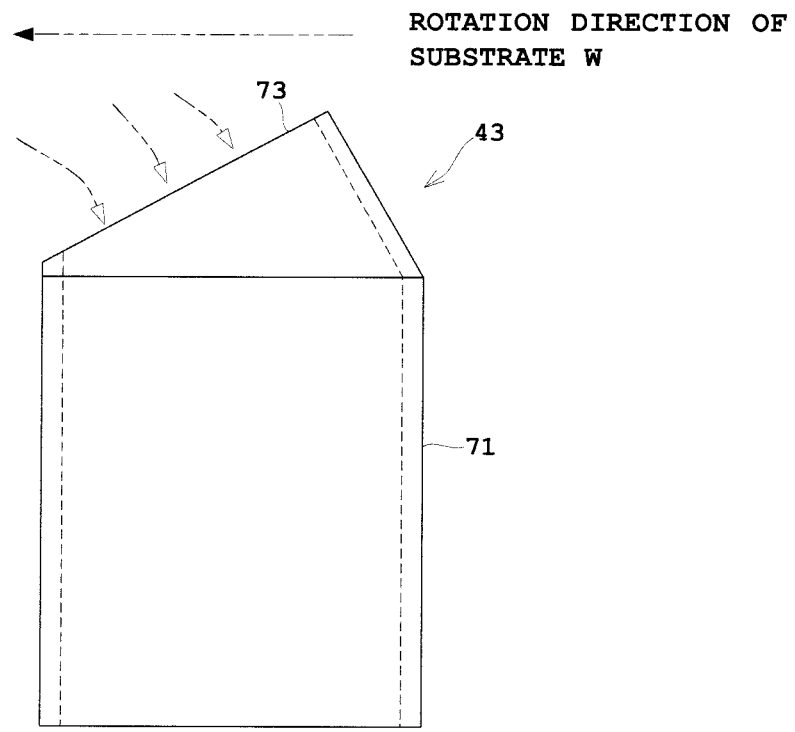
FIG. 8 is a side view of the exhaust ports.
Figure 9:
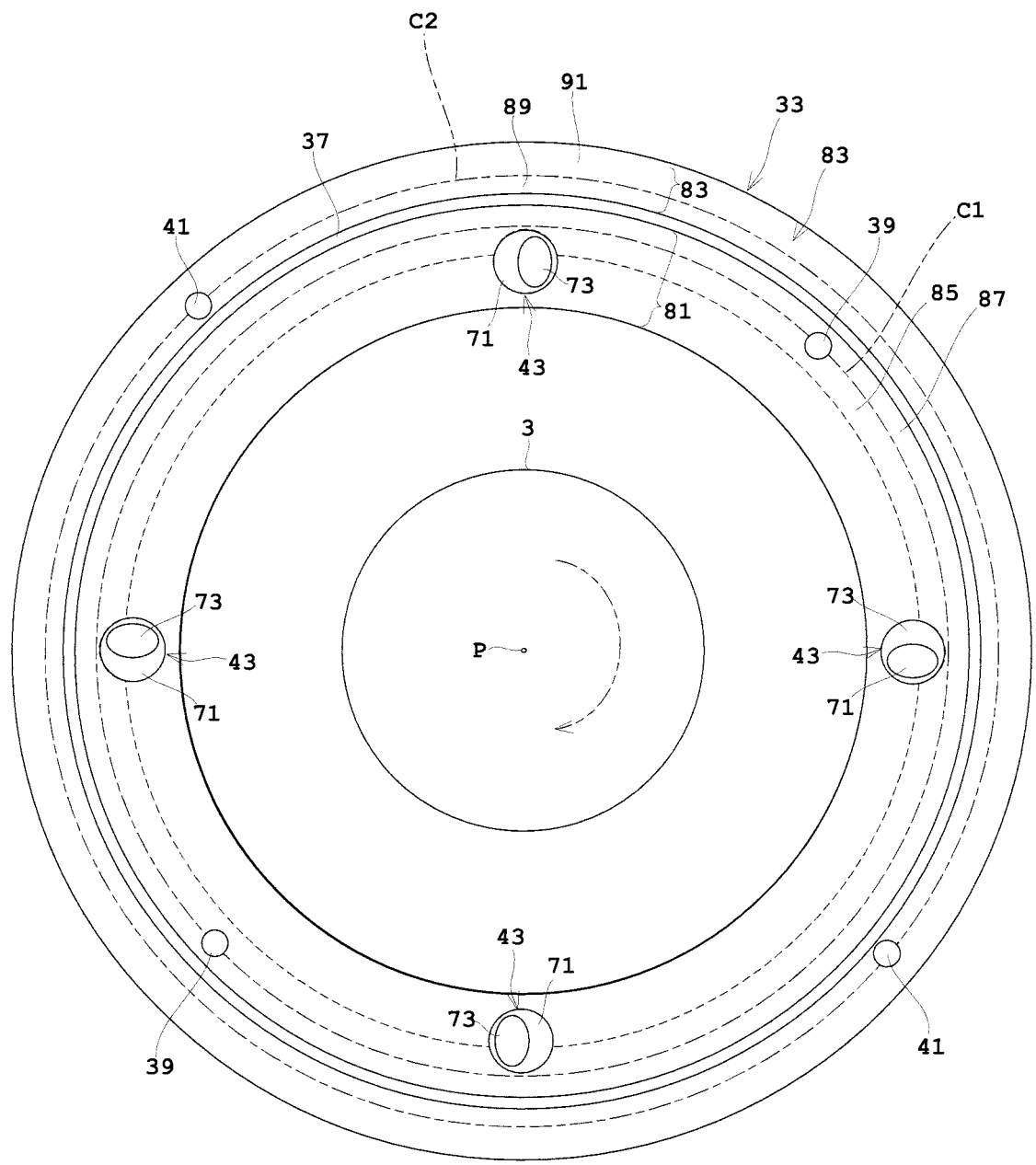
FIG. 9 is a plan view illustrating locations of the exhaust ports and drain outlets.

Now reference is made to FIGS. 6 to 9. FIG. 6 is a perspective view illustrating the exterior bottom cup with the exterior cup body and the interior cup body removed therefrom. FIG. 7 is a plan view illustrating a positional relationship of the exhaust ports. FIG. 8 is a side view of the exhaust ports. FIG. 9 is a plan view illustrating locations of the exhaust ports and the drain outlets.

As illustrated in FIGS. 7 and 9, the first exhaust ports 43 are formed at four points. The first exhaust ports 43 are disposed at equal angular intervals from the center in plan view. In the present embodiment, the number of the first exhaust ports 43 is four. Accordingly, the first exhaust ports 43 are disposed at intervals of 90 degrees 3 relative to one another. The first exhaust ports 43 each include a hollow part 71 extending upwardly from the bottom face of the exterior bottom cup 33 and an opening 73 formed on an upper portion of the hollow part 71. The first exhaust ports 43 are each disposed at a level not to contact the undersurface of the middle cup 29, and the opening 73 is directed opposite to a rotation direction of the substrate holder 3. The middle cup 29 covers the upper portion of the opening 73 to prevent the developing solution and the rinse liquid for positive tone development from flowing into the first exhaust port 43. This achieves exhaust of the gas within the interior cup 23 with an enhanced degree of gas-liquid separation.

The opening 73 of the first exhaust port 43 is directed opposite to a direction of airflow caused by the rotation. This achieves prevention of the developing solution and the rinse liquid for positive tone development as well as the mist thereof from flowing on the airflow into the first exhaust port 43. Accordingly, an enhanced degree of gas-liquid separation is obtainable. Moreover, the opening 73 of the first exhaust port 43 is spaced upwardly from the bottom face of the exterior bottom cup 33. This allows prevention of mixture of the gas with the developing solution and the rinse liquid for positive tone development collected on the bottom face of the exterior bottom cup 33.

As illustrated in FIGS. 6 and 7, the second exhaust ports 45 are formed at four points. The second exhaust ports 45 are disposed at equal angular intervals relative to one another from the center in plan view. In the present embodiment, the number of the second exhaust ports 45 is four. Accordingly, the second exhaust ports 45 are disposed at intervals of 90 degrees relative to one another. In addition, shifting the positional relationship of the four second exhaust ports 45 by 90 degrees in plan view obtains the position relationship of the four first exhaust ports 43.

Such shifting by 90 degrees obtains sufficient intervals between adjacent exhaust ports even with arrangement of the four first exhaust ports 43 and the four second exhaust ports 45. This achieves an uncomplicated configuration of the exhaust ports.

The second exhaust ports 45 are arranged at four corners of the exterior bottom cup 33 that extend laterally from the outer periphery of the exterior cup 19 in a substantially circular shape in plan view. In other words, the second exhaust ports 45 are disposed on the outer periphery of the exterior cup body 31. The lateral side cup 35 has through holes 75 at positions corresponding to the second exhaust ports 45. The through holes 75 are covered by a through hole cover 77. Exhaust pipes 79 are attached to the exterior bottom cup 33 such that the upper end thereof opens in a space formed by the lateral side cup 35, the through hole cover 77, and the exterior bottom cup 33. Moreover, the exhaust pipes 79 each have an upper end that is located above the upper portion of the through hole 75. That is, the gas from the through hole 75 once runs upwardly to flow into the space formed by the through hole cover 77 and the exterior bottom cup 33, and thereafter the gas is exhausted from the upper end of the exhaust pipe 79 to the second exhaust port 45.

Such a configuration allows the second exhaust ports 45 to be each disposed on the outer periphery of the exterior cup 21, leading to a sufficient distance from the first exhaust ports 43 individually. This allows an uncomplicated gas exhaust configuration. Moreover, exhaust of airflow through the through holes 75 of the lateral side cup 35 toward the upper end of the exhaust pipe 79 causes only the gas with the mist to be exhausted, thereby preventing mixture of the developing solution and the rinse liquid for negative tone development from entering into the opening 73 of the second exhaust port 45.

As mentioned above, provision of the first exhaust ports 43 and the second exhaust ports 45 allows the interior cup 23 to exhaust the gas containing the mist of the developing solution and the rinse liquid for positive tone development and allows the exterior cup 21 to exhaust the gas containing the mist of the developing solution and the rinse liquid for negative tone development. Therefore, this achieves even and uniform atmospheres within the interior cup 21 and the exterior cup 21, leading to enhanced in-plane consistency for treatment of the substrate W with the developing solution and the rinse liquid for positive tone development as well as for treatment of the substrate W with the developing solution and the rinse liquid for negative tone development, respectively.

An inner portion of the bottom face of the exterior bottom cup 33 separated by the separation partition 37 has an inner periphery channel 81 and an outer periphery channel 83 formed therein. The first drain outlets 39 are formed at two locations of the inner periphery channel 81. Specifically, the first drain outlets 39 are formed opposite to each other across an axis P in plan view. Moreover, the second drain outlets 41 are formed at two locations of the outer periphery channels 83. Specifically, the second drain outlets 41 are formed opposite to each other across the axis P in plan view, and have a positional relationship between the two first drain outlets 39 that is axisymmetric relative to a vertical line drawn through the axis P in FIG. 9.

The inner periphery channel 81 has an inner periphery slope 85 and an outer periphery slope 87. The inner periphery slope 85 is gradually inclined downwardly relative to the first drain outlet 39 from a portion inside a circle C1 that passes the centers of the first two drain outlets 39. The outer periphery slope 87 is gradually inclined downwardly relative to the first drain outlet 39 from a portion outside the circle C1. See FIG. 3 or 4.

The outer periphery channel 83 has an inner periphery slope 89 and an outer periphery slope 91. The inner periphery slope 89 is gradually inclined downwardly relative to the second drain outlet 41 from a portion inside a circle C2 that passes the centers of the second two drain outlets 41. The outer periphery slope 91 is gradually inclined downwardly relative to the second drain outlet 41 from a portion outside the circle C2. See FIG. 3 or 4.

As noted above, the exterior bottom cup 33 includes at the bottom face thereof the inner periphery slope 85 and the outer periphery slope 87. This enhances exhaust efficiency of the developing solution and the rinse liquid for positive tone development to the first drain outlets 39. Moreover, the bottom face of the exterior bottom cup 33 includes the slope composed of the inner periphery slope 85 and the outer periphery slope 87, leading to avoidance of drawbacks such as caused by splattering of the developing solution and the rinse liquid for positive tone development, having flown downwardly from the above, against the bottom face to cause adhesion to the substrate W. Moreover, the bottom face with the inner periphery slope 89 and the outer periphery slope 91 allows enhanced exhaust efficiency of the developing solution and the rinse liquid for negative tone development to the second drain outlets 41. Moreover, the bottom face of the exterior bottom cup 33 includes the slope composed of the inner periphery slope 89 and the outer periphery slope 91. This achieves avoidance of drawbacks such as caused by splattering of the developing solution and the rinse liquid for negative tone development, having flown downwardly from the above, against the bottom face to cause adhesion to the substrate W.

Moreover, the inner periphery channel 81 has a slope that is gradually inclined downwardly relative to each of the first drain outlets 39 in a circumferential direction. That is, the inner periphery channel 81 has the slope that is higher in level around the midstream of the first two drain outlets 39 and gradually lowers toward each of the first drain outlets 39. Likewise, the outer periphery channel 83 has a slope that is gradually inclined downwardly relative to the second drain outlets 41 in the circumferential direction.

Such a formed slope allows the developing solution and the rinse liquid for positive tone development and negative tone development, having flown to areas away from the first drain outlets 39 and the second drain outlets 41 formed at the bottom face of the exterior bottom cup 33, to flow downwardly into the first drain outlets 39 and the second drain outlets 41, respectively. This allows enhanced collection efficiency of the developing solution and the rinse liquid for positive tone development and negative tone development, respectively.

It is preferred that the bottom face of the exterior bottom cup 33 undergoes a hydrophilic treatment. Specifically, it is preferred that the inner periphery channel 81 and the outer periphery channel 83 both undergo the hydrophilic treatment at the top face thereof.

The bottom face of the exterior bottom cup 33, especially the inner periphery channel 81, undergoes the hydrophilic treatment, leading to difficulty in splattering of the developing solution and the rinse liquid for positive tone development against the bottom face of the exterior bottom cup 33 upon flowing downwardly. Consequently, such drawback is avoidable as caused by splattering of the developing solution and the rinse liquid for positive tone development to cause adhesion to the substrate W. Moreover, this achieves enhanced fluidity of the developing solution and the rinse liquid for positive tone development and negative tone development at the bottom face of the exterior bottom cup 33, leading to convenient collection at the first drain outlets 39 and the second drain outlets 41, respectively.

When a positive photoresist is applied to the substrate W held with the substrate holder 3, the substrate treating apparatus configured as above causes the controller 69 to perform a developing process with the developing solution and the rinse liquid for positive tone development. Firstly, the controller 69 causes the air cylinder 59 to extend. Accordingly, the interior cup 23 moves upwardly into the "collecting position" where the inlet A is opened. Thereafter, the controller 69 causes the nozzle 13 to move to the axis P, and causes the electric motor 7 to actuate to increase a rotation speed to a processing rotation speed for supplying the developing solution for positive tone development to the substrate W for a predetermined period of time. At this time, the developing solution for positive tone development scattering from the substrate W is collected in the interior cup 23 through the first drain outlets 39. Moreover, the gas within the interior cup 23 containing the mist of the developing solution for positive tone development flows downwardly within the interior cup 23 and is exhausted through the first exhaust ports 43. Thereafter, the controller 69 causes the nozzle 14, instead of the nozzle 13, to move to the axis P for supplying the rinse liquid for positive tone development for a predetermined period of time. Likewise, the gas containing the rinse liquid for the positive tone development and the mist thereof is collected/exhausted into/from the interior cup 23.

Next, when a negative photoresist is applied to the substrate W held with the substrate holder 3, the controller 69 performs a developing process with the developing solution and the rinse liquid for negative tone development. Firstly, the controller 69 causes the air cylinder 59 to retract. This moves the interior cup 23 downwardly into the "retracting position" where the inlet B is opened. Then the controller 69 causes the nozzle 15 to move to the axis P, and causes the electric motor 7 to actuate to increase a rotation speed to a processing rotation speed for supplying the developing solution for negative tone development to the substrate W for a predetermined period of time. At this time, the developing solution for negative tone development scattering from the substrate W is collected in the exterior cup 21 through the second drain outlets 41. Moreover, the gas within the exterior cup 21 containing the mist of the developing solution for negative tone development flows downwardly within the exterior cup 21 and is exhausted through the second exhaust ports 45. Thereafter, the controller 69 causes the nozzle 16, instead of the nozzle 15, to move to the axis P for supplying the rinse liquid for negative tone development for a predetermined period of time. Likewise, the gas containing the rinse liquid for the negative tone development and the mist thereof is collected/exhausted into/from the exterior cup 21.

With the apparatus according to the present embodiment, no mixture of the gas within the interior cup 23 and the gas within the exterior cup 21 is generated, leading to high-quality treatment to the substrate W in use of both the interior cup 23 and the exterior cup 21. Moreover, the interior cup body 47 includes no bottom face, leading to reduction in weight of the interior cup 23. Therefore, suppressed load is obtainable when the air cylinder 59 shifts the interior cup body 47 via the annular member 61, achieving rapid movement of the interior cup body 47. Moreover, the developing solution and the rinse liquid for positive tone development are also collected on the bottom face of the exterior bottom cup 33 disposed away therebelow, leading to avoidance of adverse effects caused by splattering of the developing solution and the rinse liquid for positive tone development.

With the apparatus according to the present embodiment, since the first exhaust ports 43 are disposed in the interior cup 23 at equal angular intervals in plan view, the interior cup 23 allows exhaust of the gas containing the mist of the developing solution and the rinse liquid for positive tone development. Therefore, this achieves an even and uniform atmosphere within the interior cup 23, leading to enhanced in-plane consistency for treatment of the substrate W with the developing solution and the rinse liquid for positive tone development.

Moreover, with the apparatus according to the present embodiment, the opening 73 of the first exhaust port 43 is directed opposite to a direction of airflow caused by the rotation. This achieves prevention of the developing solution and the rinse liquid for positive tone development from flowing on the airflow into the first exhaust port 43. Accordingly, an enhanced degree of gas-liquid separation is obtainable.

Moreover, the exterior bottom cup 33 includes at the bottom face thereof the inner periphery slope 85 and the outer periphery slope 87. This enhances exhaust efficiency of the developing solution and the rinse liquid for positive tone development at the first drain outlets 39. Moreover, the bottom face of the exterior bottom cup 33 includes the slope composed of the inner periphery slope 85 and the outer periphery slope 87, leading to avoidance of drawbacks such as caused by splattering of the developing solution and the rinse liquid for positive tone development, having flown downwardly from the above, against the bottom face to cause adhesion to the substrate W.

The present invention is not limited to the foregoing examples, but may be modified as follows.

(1) In the embodiments mentioned above, the substrate treating apparatus performing the positive tone development and the negative tone development has been described as one example. However, this is not limitative in the present invention. For instance, the present invention is applicable to various types of apparatus that perform treatment to substrates W with processing liquids, such as cleaning or application treatment to substrates W.

(2) In the embodiments mentioned above, the three connecting parts 63 are attached to the annular member 61 at equal intervals in plan view. However, this arrangement is not limitative in the present invention. That is, a plurality of connecting part 63 may be disposed at unequal intervals in plan view.

(3) In the embodiments mentioned above, the interior cup body 47 is composed of the guiding unit 51 and the partition accommodating part 53. However, the partition accommodating part 53 is not necessarily provided as long as the atmosphere of the separation partition 53 is able to be separated into an inner periphery side and an outer periphery side and the interior cup body 47 is movable upwardly/downwardly in a stable manner.

(4) In the embodiments mentioned above, the air cylinder 59 has been described as one example of the drive unit. However, the drive unit is not limited to the air cylinder 59 in the present invention. That is, the drive unit just has to shift the annular member 61 upwardly/downwardly, and thus may be formed by a ball screw and an electric motor.

(5) In the embodiments mentioned above, the first exhaust ports 43 are each composed of the hollow part 71 and the opening 73. However, the hollow part 71 is not necessarily provided when the first drain outlets 39 are higher in level than the bottom face of the exterior bottom cup 33 where the first exhaust ports 43 are disposed.

(6) In the embodiments mentioned above, the first four exhaust ports 43 and the second four exhaust ports 45 are provided so as to be shifted by 90 degrees in plan view. However, there is no need to shift these ports as long as the configuration of exhausting gas is not uncomplicated. For instance, the first four exhaust ports 43 and the second four exhaust ports 45 may be disposed at substantially equal angular positions.

(7) In the embodiments mentioned above, the number of the first exhaust port 43 and the second exhaust port 45 are each four. However, the number may each be at least three and the ports may be disposed at equal intervals in plan view. Moreover, in the embodiments mentioned above, the first exhaust ports 43 and the second exhaust ports 45 are not necessarily disposed at equal angular positions in plan view. For instance, only the first exhaust ports 43 or the second exhaust ports 45 may be disposed at equal angular positions in plan view.

(8) In the embodiments mentioned above, the first exhaust ports 43 each include the hollow part 71 and the opening 73, and the opening 73 is directed opposite to the rotation direction of the substrate W. Moreover, the exterior bottom cup 33 includes at the bottom face thereof the inner periphery slope 85 and the outer periphery slope 87. However, the present invention is not necessarily provided with such configurations simultaneously. For instance, only one of the slopes may be provided depending on purposes.

(9) In the embodiments mentioned above, the bottom face of the exterior bottom cup 33 undergoes the hydrophilic treatment. However, the hydrophilic treatment is not necessary in the present invention. Likewise, the middle cup 29 does not necessarily undergo the hydrophilic treatment.

(10) In the embodiments mentioned above, the bottom face of the exterior bottom cup 33 includes the slope that is gradually inclined downwardly relative to the first drain outlet 39 and the second drain outlet 41, respectively, in the circumferential direction. However, this configuration is not necessary in the present invention.

(11) In the embodiments mentioned above, the interior cup body 47 is composed of the guiding unit 51 and the partition accommodating part 53. However, the partition accommodating part 53 is not necessarily provided as long as the atmosphere of the separation partition 53 is able to be separated into an inner periphery side and an outer periphery side and the interior cup body 47 is movable upwardly/downwardly in a stable manner.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus that treats a substrate with processing liquids, the apparatus comprising:
    a substrate holder that holds a substrate horizontally;
    a rotary drive that is connected to the substrate holder to rotate the substrate holder around a vertical axis;
    a first processing liquid supplying nozzle that supplies a first processing liquid of the processing liquids to the substrate held with the substrate holder;
    a second processing liquid supplying nozzle that supplies a second processing liquid of the processing liquids to the substrate held with the substrate holder;
    an exterior cup surrounding a lateral side of the substrate holder; and
    an interior cup disposed between the substrate holder and the exterior cup,
    the interior cup including an interior cup body having an annular shape in plan view, and an interior cup outlet that is disposed on a lower portion of the interior cup body and discharges the first processing liquid and gas within the interior cup body, and
    the exterior cup including an exterior cup body having an annular shape in plan view, an exterior bottom cup that forms a bottom of the exterior cup body, a first drain outlet that is formed in a bottom face of the exterior bottom cup and drains the first processing liquid from the interior cup outlet, a first exhaust port that is formed in the exterior bottom cup and exhausts the gas from the interior cup outlet, a second drain outlet formed in the bottom face of the exterior bottom cup and drains the second processing liquid within the exterior cup body, a second exhaust port that is formed in the exterior bottom cup and exhausts the gas in the exterior cup body, and a separation partition that is erected on the bottom face of the exterior bottom cup in an annular shape in plan view and separates the first drain outlet and the second drain outlet,
    the apparatus further comprising:
    an annular member formed separately from the interior cup body, having an annular shape in plan view, movable upwardly/downwardly along an outer periphery inside the exterior cup body and connected to the interior cup body so as not to close the interior cup outlet;
    a shifting drive which engages and moves the annular member to shift the interior cup body between a collecting position where the interior cup collects the processing liquid and a retracting position where the exterior cup collects the processing liquid, wherein
    the annular member includes a plurality of connectors that connect to the interior cup body at a corresponding plurality of points located at equal angular intervals from the center in plan view.

2. The substrate treating apparatus according to claim 1, wherein
    the interior cup body includes a guiding wall that guides downwardly the first processing liquid scattering around the substrate; and a partition accommodating part on a lower portion of the guiding wall that is formed in an inverted U-shape, and the interior cup body accommodates the separation partition into the partition accommodating part in the retracting position, and accommodates only an upper portion of the separation partition into the partition accommodating part in the collecting position.

3. The substrate treating apparatus according to claim 1, wherein the first exhaust port has an opening at a front end of a hollow portion thereof that extends upwardly from the bottom face of the exterior bottom cup.

4. The substrate treating apparatus according to claim 1, wherein the exterior cup body includes a middle cup on an inner periphery side relative to the separation partition, and the middle cup has an undersurface that is spaced away from the opening of the first exhaust port, and an outer periphery that is spaced away from an inner periphery of the separation partition and whose edge is spaced away from the bottom face of the exterior cup body.

5. The substrate treating apparatus according to claim 1, wherein the exterior bottom cup includes a slope at the bottom face that is inclined downwardly to the first drain outlet and the second drain outlet in its circumferential direction.

6. The substrate treating apparatus according to claim 1, wherein the first exhaust port has a plurality of first exhaust port openings, and the plurality of first exhaust port openings are disposed at equal angular intervals from the center in plan view.

7. The substrate treating apparatus according to claim 6, wherein the first exhaust port openings each have an opening at a front end of a hollow portion thereof that extends upwardly from the bottom face of the exterior bottom cup.

8. The substrate treating apparatus according to claim 6, wherein the interior cup body includes a guiding wall that guides downwardly the first processing liquid scattering around the substrate; and a partition accommodating part on a lower portion of the guiding wall that is formed in an inverted U-shape, and the interior cup body accommodates the separation partition into the partition accommodating part in the retracting position, and accommodates only an upper portion of the separation partition into the partition accommodating part in the collecting position.

9. The substrate treating apparatus according to claim 6, wherein the exterior cup body includes a middle cup on an inner periphery side relative to the separation partition, and the middle cup has an undersurface that is spaced away from the plurality of first exhaust port openings of the first exhaust port, and an outer periphery that is spaced away from an inner periphery of the separation partition and whose edge is spaced away from the bottom face of the exterior cup body.

10. The substrate treating apparatus according to claim 6, wherein the exterior bottom cup includes a slope at the bottom face that is inclined downwardly to the first drain outlet and the second drain outlet in its circumferential direction.

11. The substrate treating apparatus according to claim 1, wherein the second exhaust port has a plurality of second exhaust port openings, and the plurality of second exhaust port openings are disposed at equal angular intervals from the center in plan view.

12. The substrate treating apparatus according to claim 11, wherein the exterior cup body includes a lateral side cup that forms a lateral side face of the exterior bottom cup body, the second exhaust port openings are each disposed on an outer periphery of the exterior cup body, the lateral side cup includes through holes formed at positions corresponding to the second exhaust port openings, respectively, and the second exhaust port openings each include an exhaust pipe whose upper end is above an upper portion of the through hole.

13. The substrate treating apparatus according to claim 11, wherein the interior cup body includes a guiding wall that guides downwardly the first processing liquid scattering around the substrate; and a partition accommodating part on a lower portion of the guiding wall that is formed in an inverted U-shape, and the interior cup body accommodates the separation partition into the partition accommodating part in the retracting position, and accommodates only an upper portion of the separation partition into the partition accommodating part in the collecting position.

14. The substrate treating apparatus according to claim 11, wherein the exterior cup body includes a middle cup on an inner periphery side relative to the separation partition, and the middle cup has an undersurface that is spaced away from a first exhaust port opening of the first exhaust port, and an outer periphery that is spaced away from an inner periphery of the separation partition and whose edge is spaced away from the bottom face of the exterior cup body.

15. The substrate treating apparatus according to claim 11, wherein the exterior bottom cup includes a slope at the bottom face that is inclined downwardly to the first drain outlet and the second drain outlet in its circumferential direction.

16. The substrate treating apparatus according to claim 1, wherein the first exhaust port has a plurality of first exhaust port openings, the plurality of first exhaust port openings being disposed at equal angular intervals from the center in plan view, and the second exhaust port has a plurality of second exhaust port openings, the plurality of second exhaust port openings being disposed at equal angular intervals from the center in plan view.

17. The substrate treating apparatus according to claim 16, wherein the exterior cup body includes a lateral side cup that forms a lateral side face of the exterior bottom cup body, the second exhaust port openings are each disposed on an outer periphery of the exterior cup body, the lateral side cup includes through holes formed at positions corresponding to the second exhaust port openings, respectively, and the second exhaust port openings each include an exhaust pipe whose upper end is above an upper portion of the through hole.

18. The substrate treating apparatus according to claim 16, wherein
the first exhaust port openings are shifted by 90 degrees in plan view from location of the second exhaust port openings.

19. The substrate treating apparatus according to claim 16, wherein
the first exhaust port openings each have an opening at a front end of a hollow portion thereof that extends upwardly from the bottom face of the exterior bottom cup.

20. The substrate treating apparatus according to claim 16, wherein
the interior cup body includes a guiding wall that guides downwardly the first processing liquid scattering around the substrate; and a partition accommodating part on a lower portion of the guiding wall that is formed in an inverted U-shape, and
the interior cup body accommodates the separation partition into the partition accommodating part in the retracting position, and accommodates only an upper portion of the separation partition into the partition accommodating part in the collecting position.

21. The substrate treating apparatus according to claim 16, wherein
the exterior cup body includes a middle cup on an inner periphery side relative to the separation partition, and
the middle cup has an undersurface that is spaced away from the plurality of first exhaust port openings of the first exhaust port, and an outer periphery that is spaced away from an inner periphery of the separation partition and whose edge is spaced away from the bottom face of the exterior cup body.

22. The substrate treating apparatus according to claim 16, wherein
the exterior bottom cup includes a slope at the bottom face that is inclined downwardly to the first drain outlet and the second drain outlet in its circumferential direction.

23. The substrate treating apparatus according to claim 1, wherein
the bottom face of the exterior bottom cup includes an inner periphery slope gradually inclined from an inner periphery side relative to the first drain outlet and an outer periphery slope gradually inclined from an outer periphery side relative to the first drain outlet, and
the first exhaust port is formed in the exterior bottom cup and forms an opening at an upper portion of a hollow part extending upwardly from the bottom face such that the opening is directed to a direction opposite to a direction of airflow caused by a rotation of the substrate holder.

24. The substrate treating apparatus according to claim 23, wherein
the exterior bottom cup includes a slope at the bottom face that is inclined downwardly to the first drain outlet and the second drain outlet in its circumferential direction.

25. The substrate treating apparatus according to claim 23, wherein the bottom face of the exterior bottom cup has a hydrophilic surface.

26. The substrate treating apparatus according to claim 23, wherein
the interior cup body includes a guiding wall that guides downwardly the first processing liquid scattering around the substrate; and a partition accommodating part on a lower portion of the guiding wall that is formed in an inverted U-shape, and
the interior cup body accommodates the separation partition into the partition accommodating part in the retracting position, and accommodates only an upper portion of the separation partition into the partition accommodating part in the collecting position.

27. The substrate treating apparatus according to claim 23, wherein
the exterior cup body includes a middle cup on an inner periphery side relative to the separation partition, and
the middle cup has an undersurface that is spaced away from the opening of the first exhaust port, and an outer periphery that is spaced away from an inner periphery of the separation partition and whose edge is spaced away from the bottom face of the exterior cup body.

28. The substrate treating apparatus according to claim 27, wherein the middle cup has a hydrophilic surface.

29. A substrate treating apparatus that treats a substrate with processing liquids, the apparatus comprising:
a substrate holder that holds a substrate horizontally;
a rotary drive that is connected to the substrate holder to rotate the substrate holder around a vertical axis;
a first processing liquid supplying nozzle that supplies a first processing liquid of the processing liquids to the substrate held with the substrate holder;
a second processing liquid supplying nozzle that supplies a second processing liquid of the processing liquids to the substrate held with the substrate holder;
an exterior cup surrounding a lateral side of the substrate holder; and
an interior cup disposed between the substrate holder and the exterior cup,
the interior cup including
an interior cup body having an annular shape in plan view,
an interior cup outlet that is disposed on a lower portion of the interior cup body and discharges the first processing liquid and gas within the interior cup body, and
the exterior cup including
an exterior cup body having an annular shape in plan view,
an exterior bottom cup that forms a bottom of the exterior cup body,
a first drain outlet that is formed in a bottom face of the exterior bottom cup and drains the first processing liquid from the interior cup outlet,
a first exhaust port formed in the exterior bottom cup and forming an opening at an upper portion of a hollow part extending upwardly from the bottom face such that the opening is directed to a direction opposite to a direction of airflow caused by a rotation of the substrate holder, for exhausting the gas from the interior cup outlet,
a second drain outlet formed in the bottom face of the exterior bottom cup and drains the second processing liquid within the exterior cup body,
a second exhaust port that is formed in the exterior bottom cup and exhausts the gas in the exterior cup body, and
a separation partition that is erected on the bottom face of the exterior bottom cup in an annular shape in plan view and separates the first drain outlet and the second drain outlet, wherein
the interior cup body moves between a collecting position where the interior cup collects the processing liquid and a retracting position where the exterior cup collects the processing liquid.

30. The substrate treating apparatus according to claim 29, wherein
the bottom face of the exterior bottom cup includes an inner periphery slope that is gradually inclined downwardly from an inner periphery side relative to the first drain outlet toward the first drain outlet, and an outer periphery slope that is gradually inclined downwardly from an outer periphery side relative to the first drain outlet toward the first drain outlet.

31. The substrate treating apparatus according to claim 29, wherein the exterior bottom cup includes a slope at the bottom face that is inclined downwardly to the first drain outlet and the second drain outlet in its circumferential direction.

32. The substrate treating apparatus according to claim 29, wherein the bottom face of the exterior bottom cup has a hydrophilic surface.

33. The substrate treating apparatus according to claim 29, wherein the interior cup body includes a guiding wall that guides downwardly the first processing liquid scattering around the substrate; and a partition accommodating part on a lower portion of the guiding wall that is formed in an inverted U-shape, and the interior cup body accommodates the separation partition into the partition accommodating part in the retracting position, and accommodates only an upper portion of the separation partition into the partition accommodating part in the collecting position.

34. The substrate treating apparatus according to claim 29, wherein the exterior cup body includes a middle cup on an inner periphery side relative to the separation partition, and the middle cup has an undersurface that is spaced away from the opening of the first exhaust port, and an outer periphery that is spaced away from an inner periphery of the separation partition and whose edge is spaced away from the bottom face of the exterior cup body.

35. The substrate treating apparatus according to claim 34, wherein the middle cup has a hydrophilic surface.

* * * * *